United States Patent
Lee et al.

(10) Patent No.: US 9,461,084 B2
(45) Date of Patent: Oct. 4, 2016

(54) IMAGE SENSOR HAVING SHIELDING STRUCTURE

(71) Applicant: SAMSUNG ELECTRONICS CO., LTD., Suwon-Si, Gyeonggi-Do (KR)

(72) Inventors: Yun-Ki Lee, Seoul (KR); Chang-Rok Moon, Seoul (KR); Min-Wook Jung, Yongin-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 8 days.

(21) Appl. No.: 14/626,549

(22) Filed: Feb. 19, 2015

(65) Prior Publication Data

US 2016/0056188 A1 Feb. 25, 2016

(30) Foreign Application Priority Data

Aug. 22, 2014 (KR) ........................ 10-2014-0109920

(51) Int. Cl.
*H01L 27/146* (2006.01)

(52) U.S. Cl.
CPC ....... *H01L 27/1463* (2013.01); *H01L 27/1464* (2013.01); *H01L 27/14607* (2013.01); *H01L 27/14623* (2013.01); *H01L 27/14636* (2013.01); *H01L 27/14687* (2013.01)

(58) Field of Classification Search
CPC .................................................... H01L 27/146
See application file for complete search history.

(56) References Cited

U.S. PATENT DOCUMENTS

| | | | |
|---|---|---|---|
| 7,087,944 B2 | 8/2006 | Rhodes et al. |
| 7,981,717 B2 | 7/2011 | Lim |
| 8,071,455 B2 | 12/2011 | Cole et al. |
| 2013/0221410 A1 | 8/2013 | Ahn |

FOREIGN PATENT DOCUMENTS

KR  10-2006-0020400  3/2006

*Primary Examiner* — Marvin Payen
(74) *Attorney, Agent, or Firm* — F. Chau & Associates, LLC

(57) ABSTRACT

An image sensor is provided. The image sensor includes a substrate, a first interlayer insulating layer, a first metal line, and a shielding structure. The substrate includes a pixel array, a peripheral circuit area, and an interface area disposed between the pixel array and the peripheral circuit area. The first interlayer insulating layer is formed on a first surface of the substrate. The first metal line is disposed on the first interlayer insulating layer of the pixel array. The second interlayer insulating layer is disposed on the first interlayer insulating layer wherein the second interlayer insulating layer covers the first metal line. The shielding structure passes through the substrate in the interface area wherein the shielding structure electrically insulates the pixel array of the substrate and the peripheral circuit area.

11 Claims, 27 Drawing Sheets

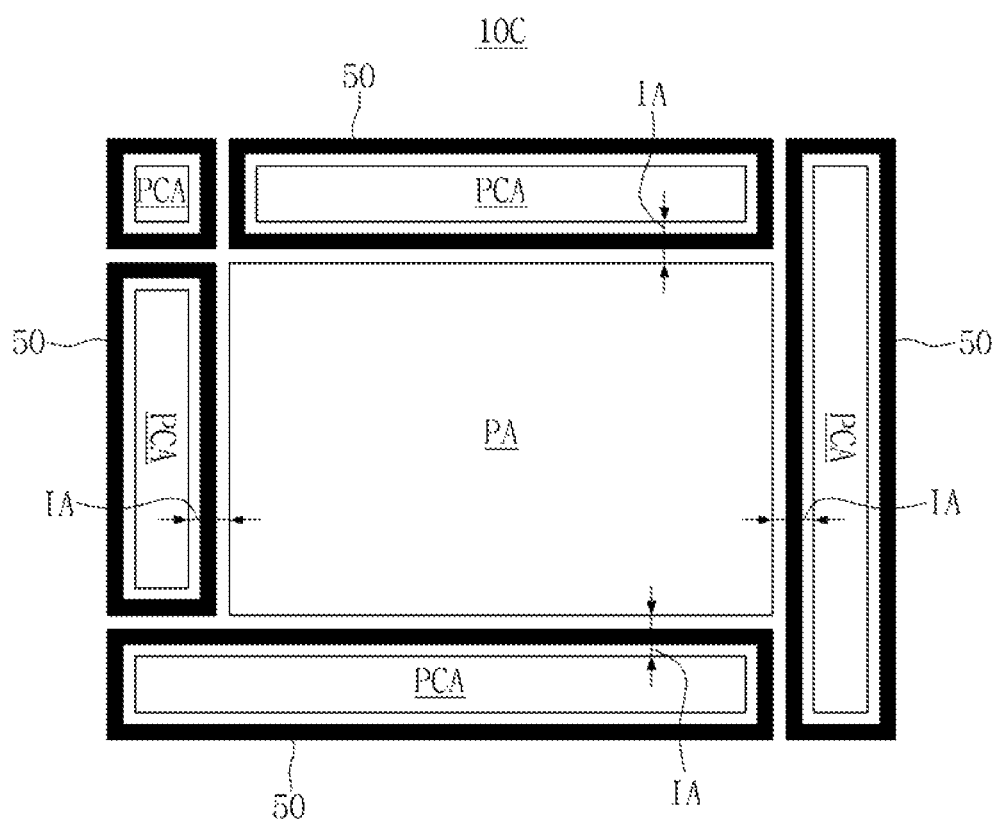

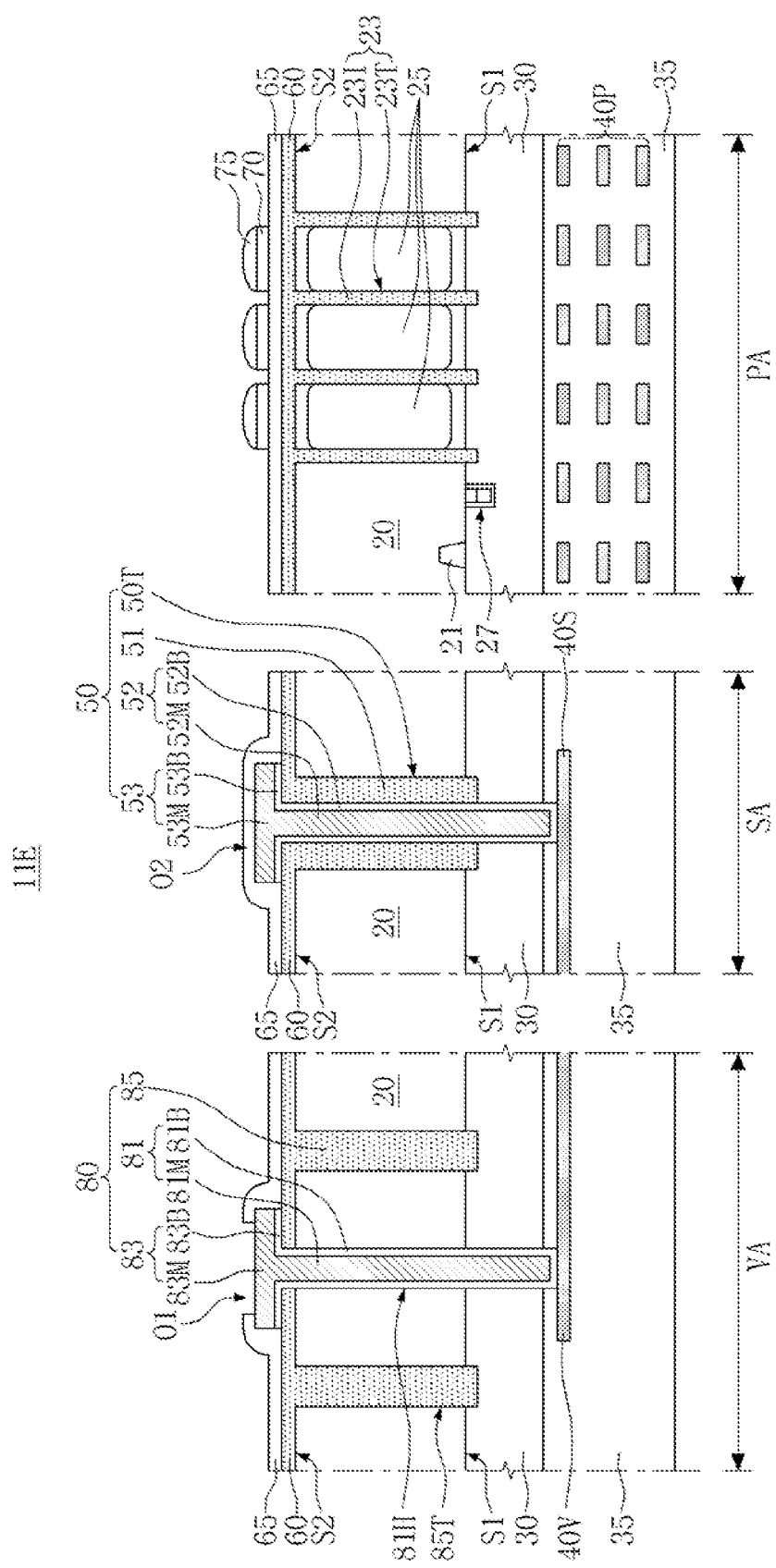

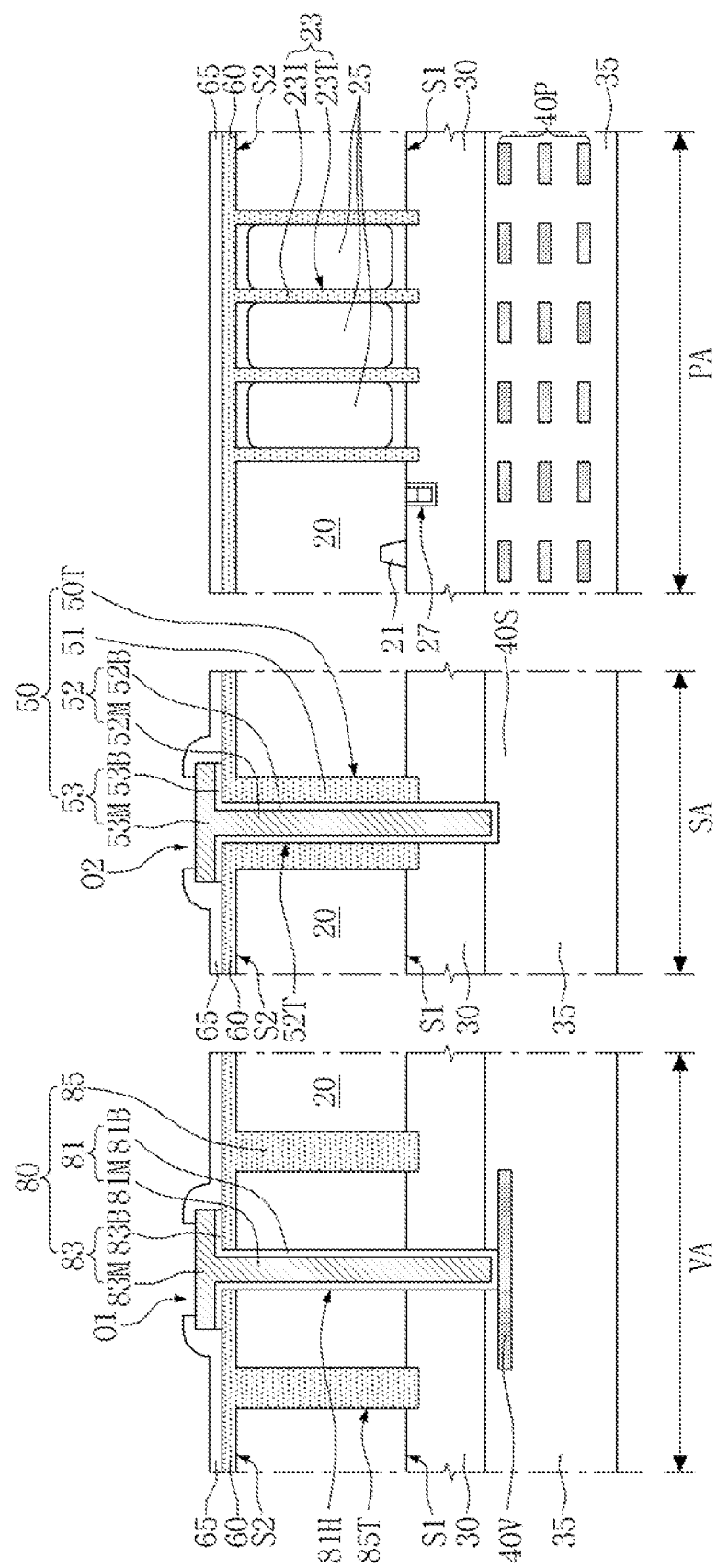

IMAGE SENSOR HAVING SHIELDING STRUCTURE

CROSS-REFERENCE TO RELATED APPLICATION

This application claims under 35 U.S.C. §119 priority to and the benefit of Korean Patent Application No. 10-2014-0109920 filed on Aug. 22, 2014, the entire contents of which are incorporated by reference herein.

BACKGROUND

1. Technical Field

The present disclosure relates to a layout and a vertical structure of a semiconductor device including a shielding structure and a method of manufacturing the same.

2. Discussion of Related Art

An image sensor having a more high resolution for a high quality display image is being developed. Since the image sensor of a high resolution has a high degree of integration and a small size, an active pixel sensor array is affected by electrical, magnetic, and thermal effects from peripheral circuits. The effects from the peripheral circuits may degrade the operation and performance of the image sensor. Thus, the active pixel sensor array should be shielded from the electrical, magnetic and thermal effects of the peripheral circuit, so that the operation and performance of the image sensor is improved.

SUMMARY

Exemplary embodiments of the inventive concepts provide an image sensor having a shielding structure.

Other exemplary embodiments of the inventive concepts provide a method of manufacturing the image sensor having the shielding structure.

In accordance with an aspect of the inventive concepts, an image sensor includes a substrate, a first interlayer insulating layer, a first metal line, and a shielding structure. The substrate includes a pixel array, a peripheral circuit area, and an interface area disposed between the pixel array and the peripheral circuit area. The first interlayer insulating layer is formed on a first surface of the substrate. The first metal line is disposed on the first interlayer insulating layer of the pixel array. The second interlayer insulating layer is disposed on the first interlayer insulating layer, wherein the second interlayer insulating layer covers the first metal line. The shielding structure passes through the substrate in the interface area to electrically isolate the pixel array of the substrate from the peripheral circuit area.

In accordance with another aspect of the inventive concepts, an image sensor includes a substrate, a first interlayer insulating layer, a pixel line, a through via line, a second interlayer insulating layer, a through via structure, and a shielding structure. The substrate includes a pixel array, a through via area, and a shield area disposed between the pixel array and the through via area. The first interlayer insulating layer is formed on a first surface of the substrate. The pixel line is disposed on the first interlayer insulating layer of the pixel array. The through via line is disposed on the first insulating layer in the through via area. The second interlayer insulating layer is disposed on the first interlayer insulating layer, wherein the second interlayer insulating layer covers the pixel line and the through via line. The through via structure passes through the substrate in the through via area. The shielding structure passes through the substrate in the shield area. The through via structure includes a via structure and a via isolation structure. The via structure passes through the substrate and the first interlayer insulating layer. The via isolation structure passes through the substrate to surround the via structure. The shielding structure passes through the substrate to electrically isolate the pixel array of the substrate from the through via area.

In accordance with still another aspect of the inventive concepts, an image sensor includes a substrate, a first interlayer insulating layer, a first metal line, a second metal line, a second interlayer insulating layer, a through via structure, and a shielding structure. The substrate includes a first area and a second area. The first interlayer insulating layer is formed on a first surface of the substrate. The first metal line is disposed on the first interlayer insulating layer in the first area. The second metal line is disposed on the first interlayer insulating layer in the second area. The second interlayer insulating layer is disposed on the first interlayer insulating layer to cover the first and second metal lines. The through via structure is disposed in the first area. The shielding structure is disposed in the second area. The through via structure includes a through via plug passing through the substrate and the first interlayer insulating layer in the first area to be electrically connected to the first metal line. The shielding structure includes a shield insulating material layer passing through the substrate in the second area and contacts the first interlayer insulating layer.

BRIEF DESCRIPTION OF THE DRAWINGS

The foregoing and other features and advantages of the inventive concepts will be apparent from the more particular description of exemplary embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 1A, 1B and 1C are conceptual block diagrams of image sensors in accordance with exemplary embodiments of the inventive concepts;

FIGS. 7A and 7B are conceptual cross-sectional views of image sensors in accordance with exemplary embodiments of the inventive concepts;

FIGS. 8A, 8B, 8C, 8D, 8E, 8F, 8G, 9A, 9B, 9C and 9D show methods of manufacturing the image sensor in accordance with exemplary embodiments of the inventive concepts;

DETAILED DESCRIPTION

Figure 1A:
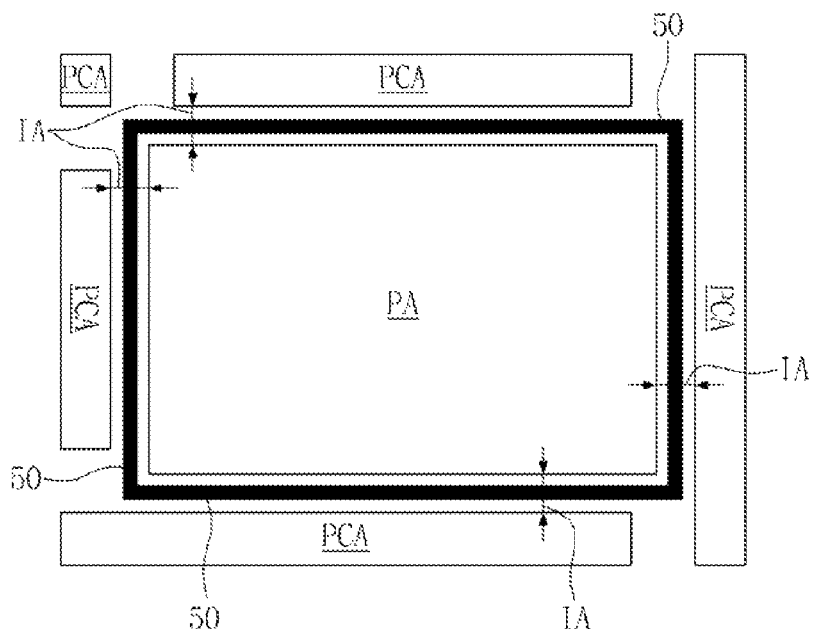

Various exemplary embodiments will now be described more fully with reference to the accompanying drawings.

The inventive concepts disclosed herein may, however, be embodied in different forms and should not be construed as limited to the exemplary embodiments set forth herein. Rather, these exemplary embodiments are provided so that this disclosure is thorough and complete and fully conveys the inventive concepts to those skilled in the art. In the drawings, the sizes and relative sizes of layers and regions may be exaggerated for clarity.

The terminology used herein is for the purpose of describing particular exemplary embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

It will be understood that, the terms of 'front side' and 'back side' are relative terms to conveniently explain the present inventive concepts. Thus, 'front side' and 'back side' do not correspond to predetermined directions, locations or elements, and 'front side' may be substituted by 'back side'. For example, 'front side' may mean 'back side'. Thus, 'front side' may be described as 'first side', and 'back side' may be described as 'second side'. Also, 'back side' may be described as 'first side, and 'front side' may be described as 'first side'. However, in the same embodiment, 'front side' may not be substituted by 'back side'. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Figure 1B:
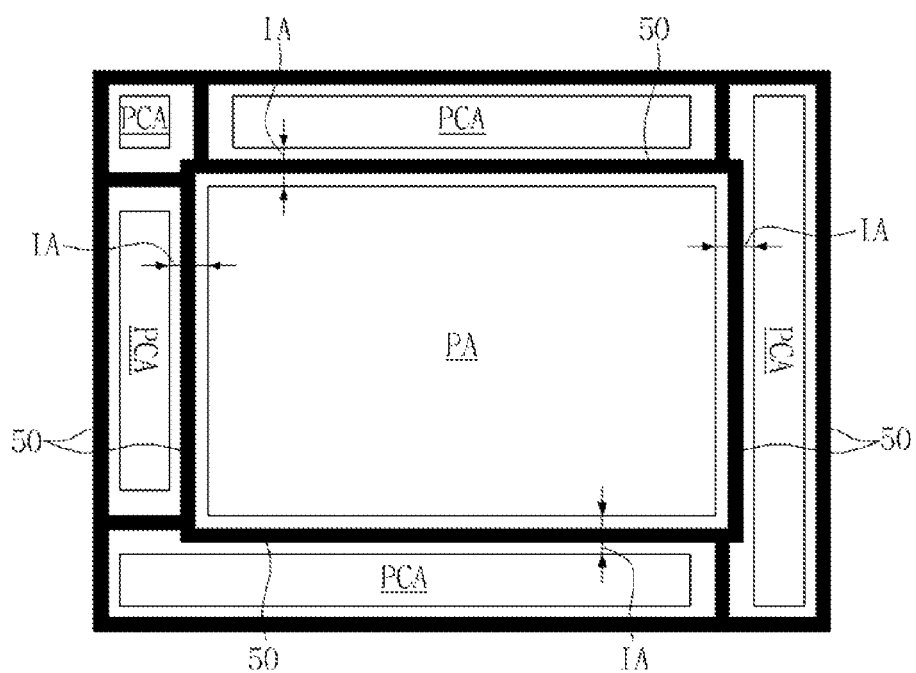

FIGS. 1A to 1C are conceptual block diagrams of image sensors 10A, 10B, 10C in accordance with exemplary embodiments of the inventive concepts.

Referring to FIGS. 1A to 1C, the image sensor 10A includes a pixel array PA, peripheral circuit areas PCA, an interface areas IA, and a shielding structure 50 formed in the interface areas IA. The pixel array PA is disposed on a center of the image sensor 10A, and includes pixels. For example, the pixel array PA may include an active pixel sensor array APS. The peripheral circuit areas PCA are disposed on the periphery of the pixel array PA. A register block, a timing generator, a ramp generator, a buffer circuit, a correlated double sampler, a comparator, an analog-to-digital converter, and the like, may be included in the peripheral circuit areas PCA. The interface areas IA may be disposed between the pixel array PA and the peripheral circuit areas PCA.

The shielding structure 50 may be disposed between the pixel array PA and the peripheral circuit areas PCA. For example, the shielding structure 50 may be formed in the interface areas IA. The shielding structure 50 may enhance electrical insulation, magnetic shielding, and thermal isolation between the pixel array PA and the peripheral circuit areas PCA.

Referring to FIG. 1A, the shielding structure 50 may surround the pixel array PA. Referring to FIG. 1B, the shielding structure 50 may surround the pixel array PA and the peripheral circuit areas PCA. Referring to FIG. 1C, the shielding structure 50 may individually surround each of the peripheral circuit areas PCA. In another exemplary embodiment, the shielding structure 50 may surround only some of the peripheral circuit areas PCA.

In the image sensors 10A, 10B, 10C in accordance with the exemplary embodiments of the inventive concepts, the peripheral circuit area PCA is electrically and physically insulated and separated from the pixel array PA. Thus, since the electrical and thermal effects on the unit pixels of the pixel array PA from the peripheral circuit areas PCA are decreased, a dark current and a white spot are decreased. Therefore, electrical, thermal, and optical operations and performances of the image sensors 10A, 10B, 10C may be superior.

Figure 2A:
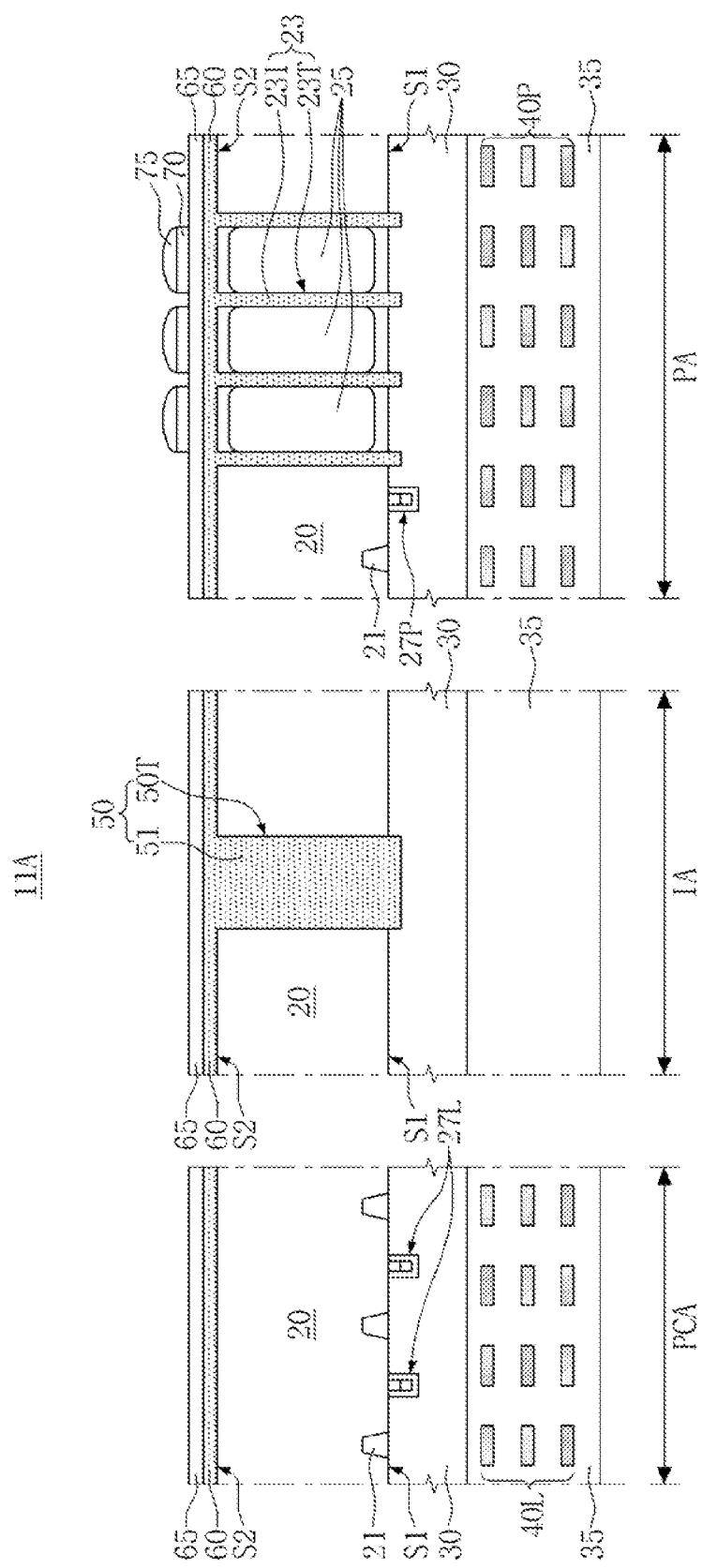
FIGS. 2A, 2B and 2C are conceptual cross-sectional views of the image sensors in accordance with exemplary embodiments of the inventive concepts.
Figure 2B:
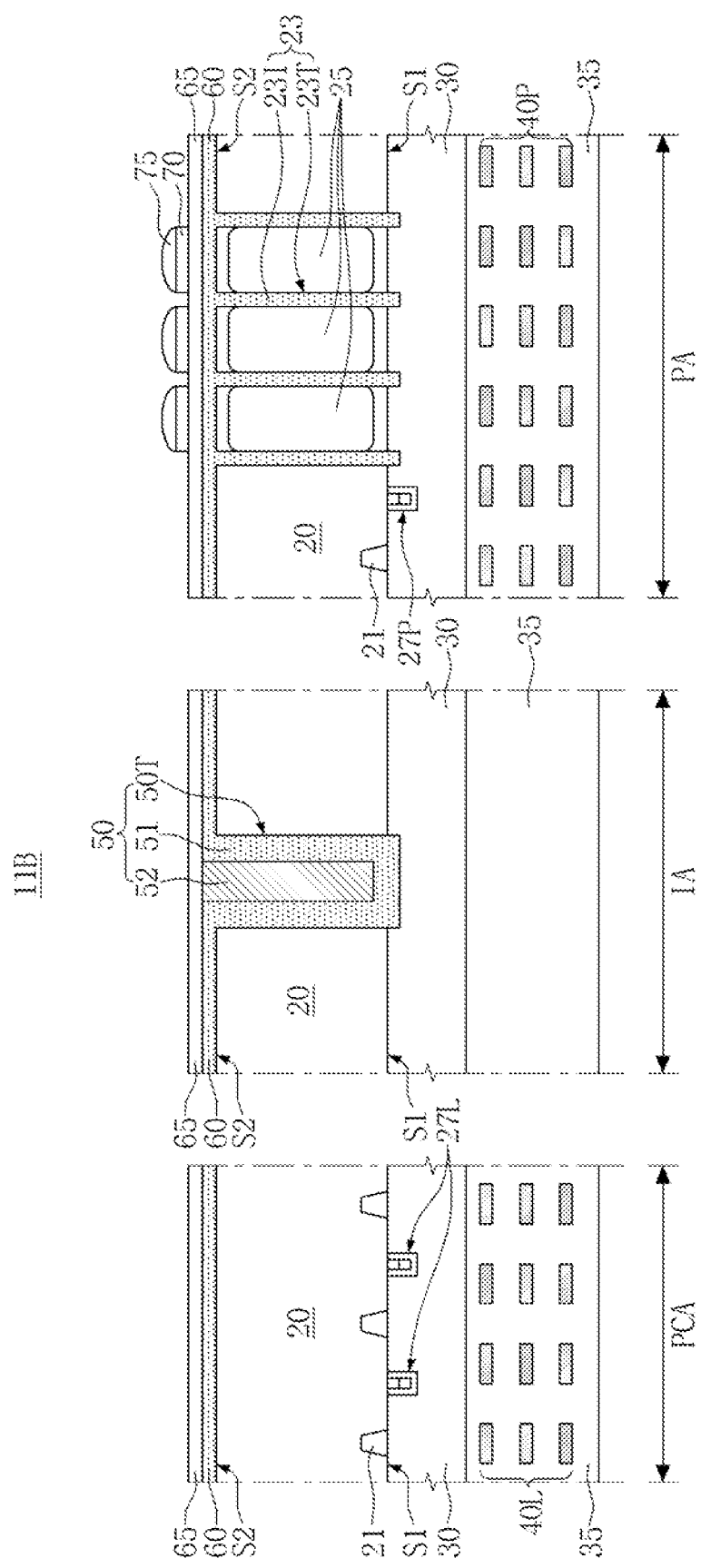
Figure 2C:
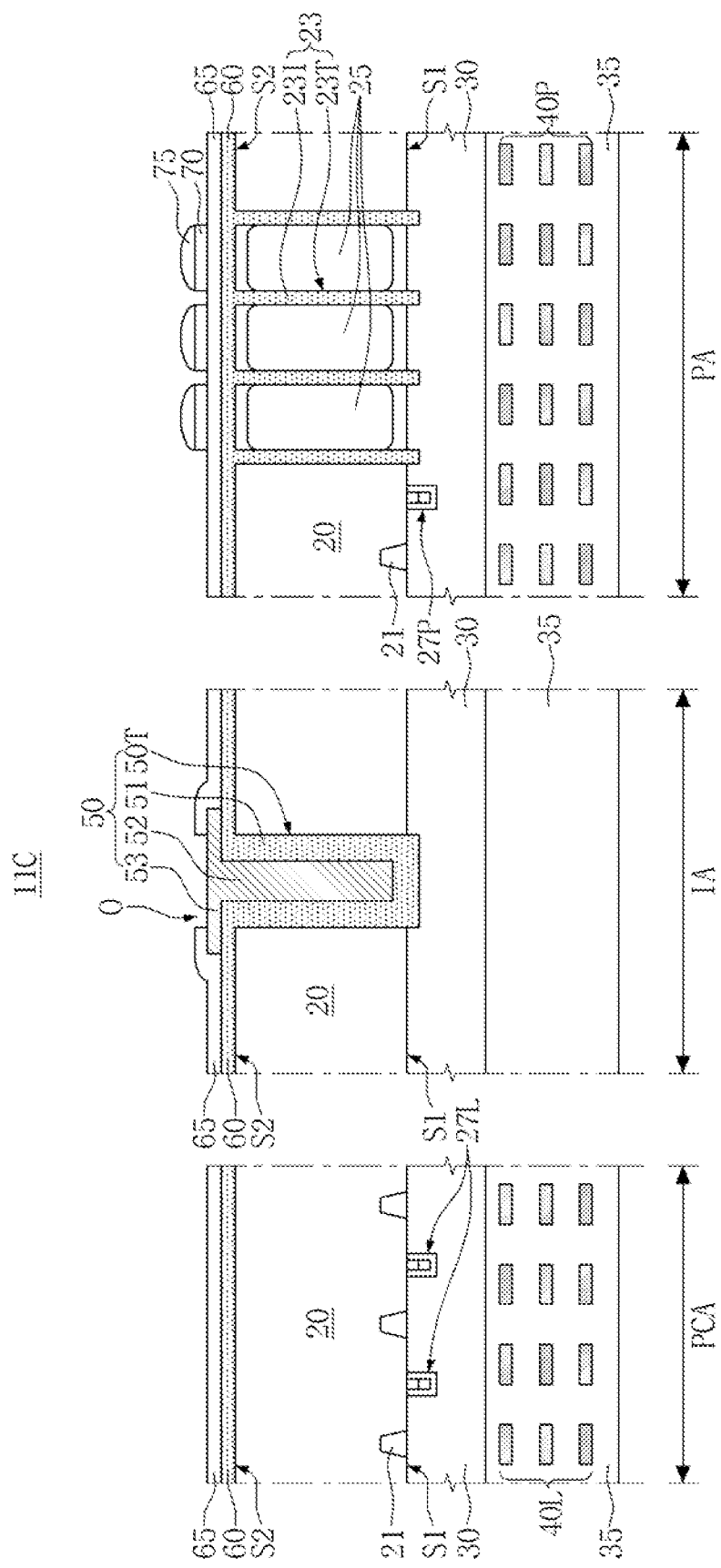

FIGS. 2A, 2B and 2C are conceptual cross-sectional views of the image sensors 11A, 11B, 11C in accordance with exemplary embodiments of the inventive concepts. FIGS. 2A to 2C each include cross-sectional views of the peripheral circuit areas PCA, the interface area IA, and the pixel array PA shown in FIGS. 1A to 1C.

Referring to FIG. 2A, the image sensor 11A includes a substrate 20, transistors 27L, 27P, a lower interlayer insulating layer 30, an upper interlayer insulating layer 35, multilayered metal lines 40L, 40P, shallow isolation areas 21, photodiodes 25, deep isolation areas 23, a shielding structure 50, a capping layer 60, a protection layer 65, color filters 70, and microlenses 75. The substrate 20 may be disposed in each of the peripheral circuit area PCA, the interface area IA and the pixel array PA. The transistors 27L, 27P, the lower interlayer insulating layer 30, the upper interlayer insulating layer 35, and the multilayered metal lines 40L, 40P are disposed on a first surface S1 of the substrate 20. The shallow isolation areas 21, the photodiodes 25, the deep isolation areas 23, the shielding structure 50 are formed in the substrate 20. The capping layer 60, the protection layer 65, the color filters 70, and the microlenses 75 are disposed on a second surface S2 of the substrate 20. The second surface S2 of the substrate 20 may be opposite the first surface S1 of the substrate 20. For example, the first surface S1 may be a front side surface of the substrate 20, and the second surface S2 may be a back side surface of the substrate 20. Alternatively, the first surface S1 may be the back side surface of the substrate 20, and the second surface S2 may be the front side surface of the substrate 20.

The transistors 27L, 27P may include logic transistors 27L and a pixel transistor 27P. In an exemplary embodiment, the logic transistors 27L are disposed in the peripheral circuit area PCA, and the pixel transistor 27P is disposed in the pixel array PA. The logic transistors 27L may form a logic circuit, a differential amplifier, a driver, or an input/output buffer, etc. The pixel transistor 27P may be one of a transmission transistor, a reset transistor, and an amplification transistor.

The lower interlayer insulating layer 30 may be formed on the first surface S1 of the substrate 20 to cover the transistors 27L, 27P. The lower interlayer insulating layer 30 may include an insulating material such as, for example, silicon oxide.

The upper interlayer insulating layer 35 may be formed on the lower interlayer insulating layer 30 to cover the multilayered metal lines 40L, 40P. The upper interlayer insulating layer 35 may have a multilayered structure. The upper interlayer insulating layer 35 may include an insulating material such as silicon oxide or silicon nitride.

The multilayered metal lines 40L, 40P may be formed in the upper interlayer insulating layer 35 as the multilayered structure. The multilayered metal lines 40L, 40P may include logic metal lines 40L and pixel lines 40P. The logic metal lines 40L are disposed in the peripheral circuit area PCA. The pixel lines 40P are disposed in the pixel array PA. The multilayered metal lines 40L, 40P may include a metal such as tungsten (W), aluminum (Al), copper (Cu), etc.

The shallow isolation areas 21 may include an insulating material formed using a shallow trench isolation (STI) process. The deep isolation areas 23 may include an insulating material formed using a deep trench isolation (DTI) process. The photodiodes 25 may include a P-doped area and an N-doped area which are formed by ion implanting process.

The shielding structure 50 may include a shield insulating material 51 filled in a shield trench 50T that passes through the substrate 20 in a vertical direction. The shielding structure 50 may pass through the substrate 20 to electrically and physically insulate and separate the pixel array PA of the substrate 20 from the peripheral circuit area PCA of the substrate 20. A lower end portion of the shielding structure 50 may pass through the first surface S1 of the substrate 20 and protrude into the lower interlayer insulating layer 30. An upper end portion of the shielding structure 50 may protrude at a higher level than the second surface S2 of the substrate 20. The shield insulating material 51 may include an insulating material such as silicon oxide. A height of the shielding structure 50 may be same as a height of the deep isolation areas 23.

The capping layer 60 may be entirely formed on the second surface S2 of the substrate 20. The capping layer 60 may include the same material as the shield insulating material 51 to physically continue with the shield insulating material 51. An upper surface of the capping layer 60 may be co-planar with an upper surface of the shielding structure 50.

The protection layer 65 may be formed on the capping layer 60. The protection layer 65 may have a multilayered structure to include an anti-reflection layer or a passivation layer. For example, the protection layer 65 may include silicon nitride, silicon oxide, silicon oxynitride, a polyimide, and/or an organic polymer.

The color filters 70 may be formed on the protection layer 65 to be aligned perpendicular to the photodiodes 25. The color filters 70 may include silicon oxide or an organic polymer including pigment.

The microlenses 75 may be aligned perpendicular to the color filters 70. The microlenses 75 may include transparent silicon oxide or an organic polymer.

Referring to FIG. 2B, the image sensor 11B according to an exemplary embodiment of the inventive concepts may include a shielding structure 50 having a shield trench 50T, a shield insulating material 51 and a shield core 52 compared with the image sensor 11A shown in FIG. 2A. The shield insulating material 51 may be conformally formed on a side wall and a bottom surface of the shield trench 50T to partially fill the shield trench 50T. The shield insulating material 51 may include silicon oxide or silicon nitride. The shield core 52 may be formed on the shield insulating material 51 to completely fill the shield trench 50T. The shield core 52 may protrude at a higher level than the second surface S2 of the substrate 20. The shield core 52 may include a metal. An upper surface of the shield core 52 may be co-planar with an upper surface of the shield insulating material 51. The shield core 52 may include a barrier layer and a metal layer.

Referring to FIG. 2C, the image sensor 11C according to an exemplary embodiment of the inventive concepts may include a shielding structure 50 having a shield trench 50T, a shield insulating material 51, a shield core 52, and a shield pad 53 compared with the image sensors 11A, 11B shown in FIGS. 2A and 2C. A positive voltage (+), a negative voltage (−), or a ground voltage may be applied to the shield core 52 through the shield pad 53. The shield pad 53 may include the same material as the shield core 52 to physically continue with the shield core 52. The shield pad 53 may be disposed on the capping layer 60. The protection layer 65 may have an opening O which exposes an upper surface of the shield pad 53. The shield pad 53 may include a barrier layer and a metal layer.

In the image sensors 11A, 11B, 11C, the peripheral circuit areas PCA of the substrate 20 are electrically and physically insulated and separated from the pixel array PA of the substrate 20.

Figure 3A:
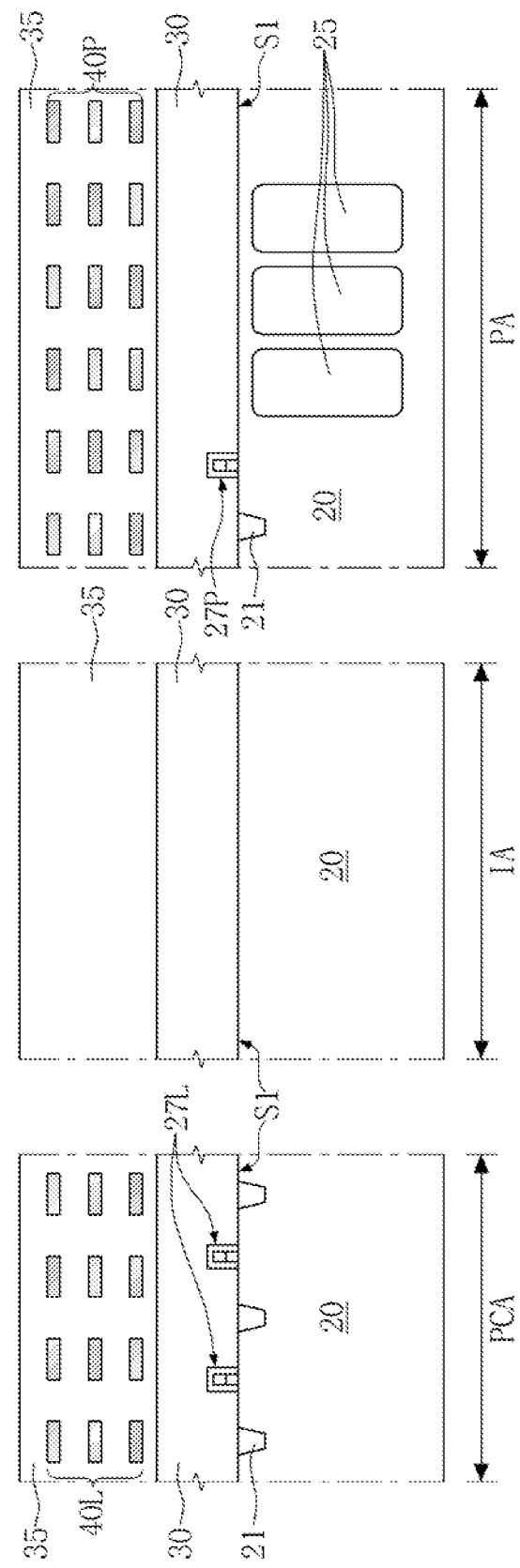
FIGS. 3A, 3B, 3C, 4A, 4B, 5A and 5B show methods of manufacturing the image sensors in accordance with exemplary embodiments of the inventive concepts.
Figure 3B:
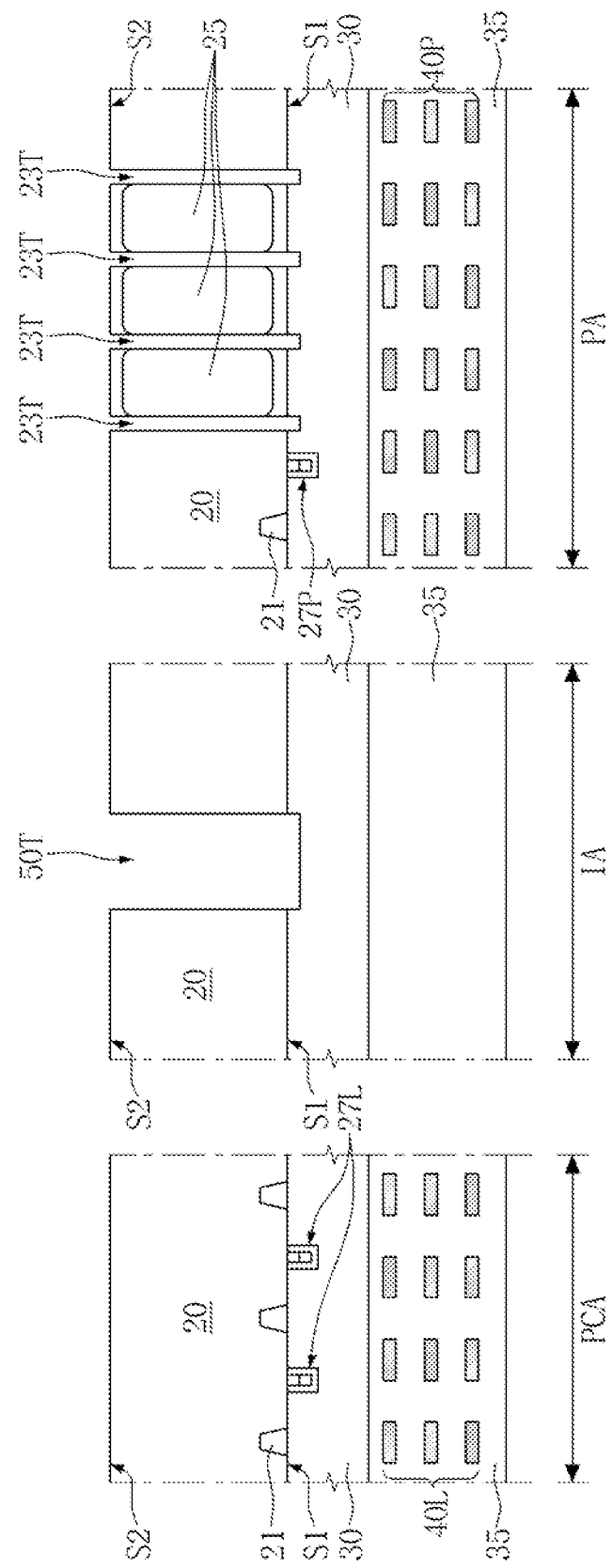
Figure 3C:
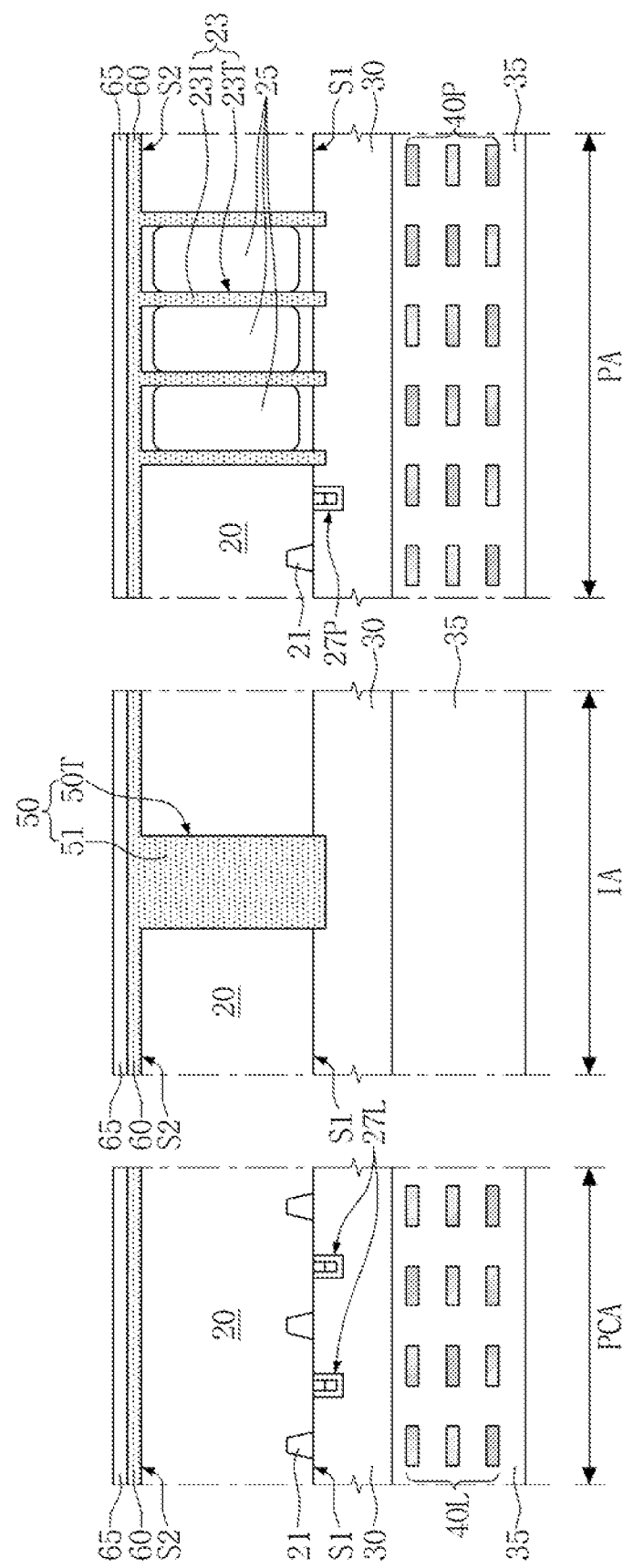

FIGS. 3A to 3C are views for describing a method of manufacturing the image sensor in accordance with exemplary embodiments of the inventive concepts.

Referring to FIG. 3A, the method of manufacturing the image sensor according to an exemplary embodiment of the inventive concepts may include preparing a substrate 20 including a peripheral circuit area PCA, an interface area IA, and a pixel array PA, forming shallow isolation areas 21 and photodiodes 25 in the substrate 20, forming transistors 27L, 27P on a first surface S1 of the substrate 20, forming a lower interlayer insulating layer 30 on the first surface S1 of the substrate to cover the transistors 27L, 27P, and forming a plurality of multilayered metal lines 40L, 40P and an upper interlayer insulating layer 35 on the lower interlayer insulating layer 30.

The interface area IA may be disposed between the peripheral circuit area PCA and the pixel array PA.

The substrate 20 may include one of a single crystalline wafer, a Si—Ge wafer, and a silicon on insulator (SOI) wafer.

The forming of the shallow isolation areas 21 may include performing a shallow trench isolation (STI) process. The forming of the photodiodes 25 may include performing an ion implanting process such as ion implanting or ion diffusion. The forming of the transistors 27L, 27P may include forming a gate insulating layer, a gate electrode, and a gate spacer on the substrate 20. The transistors 27L, 27P may include logic transistors 27L and pixel transistors 27P. The logic transistors 27L are formed in the peripheral circuit area PCA. The pixel transistors 27P are disposed in the pixel array PA.

The forming of the lower interlayer insulating layer 30 and the upper interlayer insulating layer 35 may include forming a silicon oxide by performing a chemical vapor deposition (CVD) process. The lower interlayer insulating layer 30 and the upper interlayer insulating layer 35 may be formed as a multilayer.

The forming of the metal lines 40L, 40P may include performing a CVD process, a photolithography process, an etching process, a deposition process, and/or a planarization process. For example, the metal lines 40L, 40P may include tungsten (W), aluminum (Al), copper (Cu), titanium (Ti), or another metal, a metal alloy, or a metal compound.

Referring to FIG. 3B, the method may include turning over the substrate 20, thinning the substrate 20 to partially recess and remove the second surface S2 of the substrate 20, and forming a shield trench 50T and a deep isolation trench 23T in the substrate 20. The thinning of the substrate 20 may include performing a grinding process, a polishing process, or an etching process. The shield trench 50T may be formed in the interface area IA. The deep isolation trench 23T may be formed between the photodiodes 25 in the pixel array PA. The shield trench 50T and the deep isolation trench 23T may be formed to have the same depth. The shield trench 50T and the deep isolation trench 23T may pass through the substrate 20 so that lowest bottom surfaces of the shield trench 50T and the deep isolation trench 23T may be disposed in the lower interlayer insulating layer 30.

Referring to FIG. 3C, the method may include forming a shielding structure 50, deep isolation areas 23, and a capping layer 60 by performing a CVD process and/or a gap filling process shielding structure and forming a protection layer 65 on the capping layer 60. The shielding structure 50 may include a shield insulating material 51 filling the shield trench 50T. The deep isolation areas 23 may include a deep isolation insulating material 231 filling the deep isolation trenches 23T. The shield insulating material 51, the deep isolation insulating material 231, and the capping layer 60 may be simultaneously formed to include the same material. For example, the shield insulating material 51, the deep isolation insulating material 231, and the capping layer 60 may include an insulating material such as silicon oxide or silicon nitride. The capping layer 60 may be entirely formed on the second surface S2 of the substrate 20. The protection layer 65 may include an anti-reflection layer. The protection layer 65 may be formed as a multilayered structure. For example, the protection layer 65 may include one of silicon nitride, silicon oxide, a polyimide, and an organic polymer.

Referring back to FIG. 2A, the method may include forming color filters 70 and microlenses 75 on the protection layer 65 in the pixel array PA to be aligned perpendicular to the photodiodes 25. The color filters 70 may include one of silicon oxide and an organic polymer including pigment. The microlenses 75 may include one of silicon oxide, a polyimide, and an organic polymer.

Figure 4A:
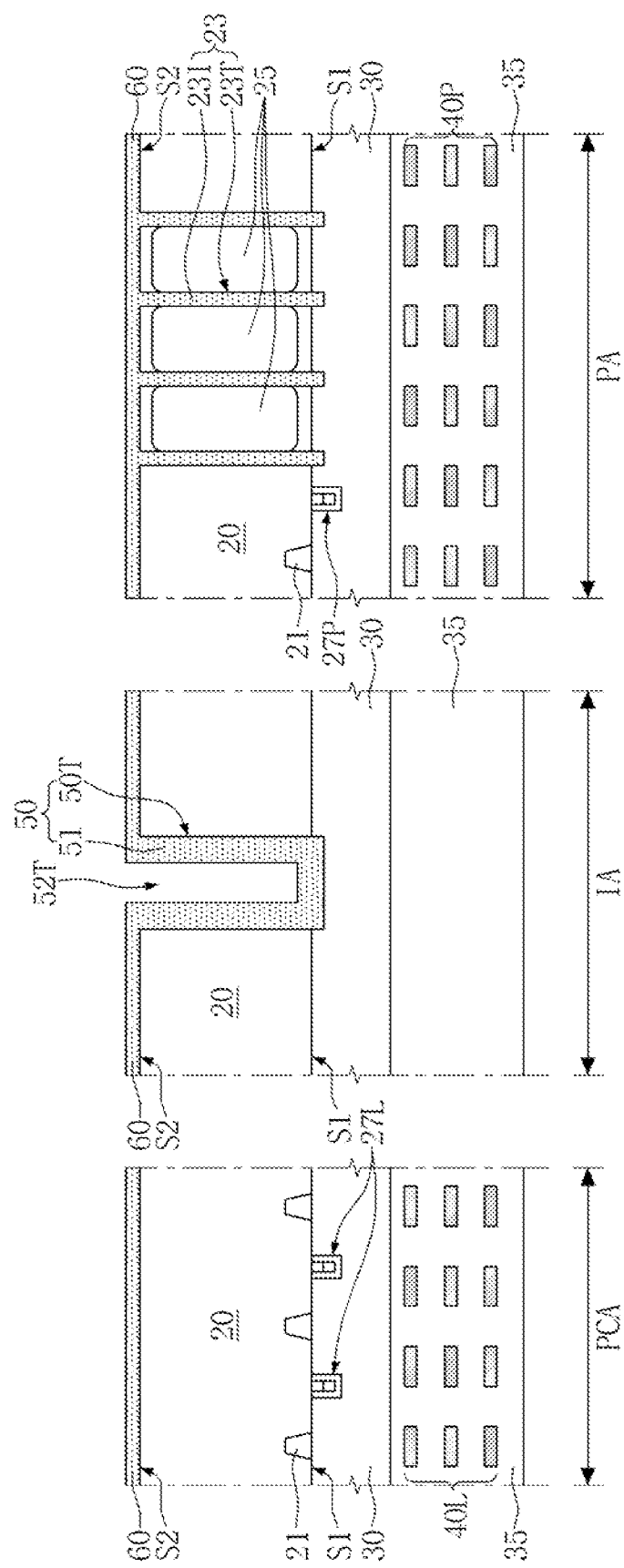
Figure 4B:
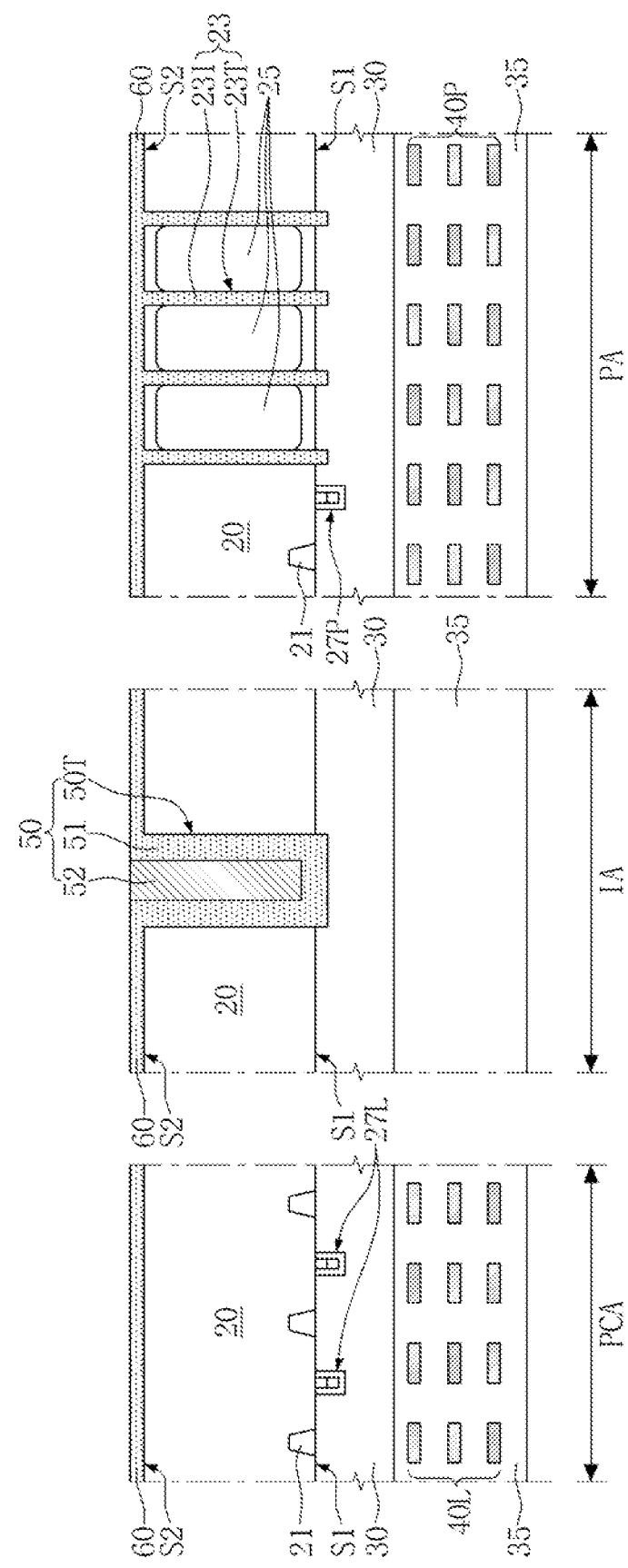

FIGS. 4A and 4B are cross-sectional views of a method of manufacturing the image sensor in accordance with exemplary embodiments of the inventive concepts.

Referring to FIG. 4A, the method of manufacturing the image sensors according to an exemplary embodiment of the inventive concepts may include forming a shield trench 50T and a deep isolation trench 23T by performing the processes described with reference to FIGS. 3A to 3C, and forming a shield insulating material 51 in the shield trench 50T and a deep isolation insulating material 231 in the deep isolation trench 23T, respectively. The shield insulating material 51 may not completely fill the shield trench 50T in an exemplary embodiment. The shield insulating material 51 may partially fill the shield trench 50T, or may be conformally formed on a side wall and a bottom surface of the shield trench 50T. The deep isolation insulating material 231 may completely fill the deep isolation trench 23T in an exemplary embodiment.

Referring to FIG. 4B, the method may include forming a shield core 52, configured to fill the shield trench 50T, on the shield insulating material 51 in the shield trench 50T by performing a CVD process and a CMP process. The shield core 52 may include a conductive material such as a metal. In the forming of the shield core 52, a shielding structure 50 including the shield insulating material 51 and the shield core 52 which fill the shield trench 50T may be formed.

Referring back to FIG. 2B, the method may include forming a protection layer 65 in the capping layer 60, and forming color filters 70 and microlenses 75 so as to be aligned perpendicular to the photodiodes 25 on the protection layer 65 in the pixel array PA.

Figure 5A:
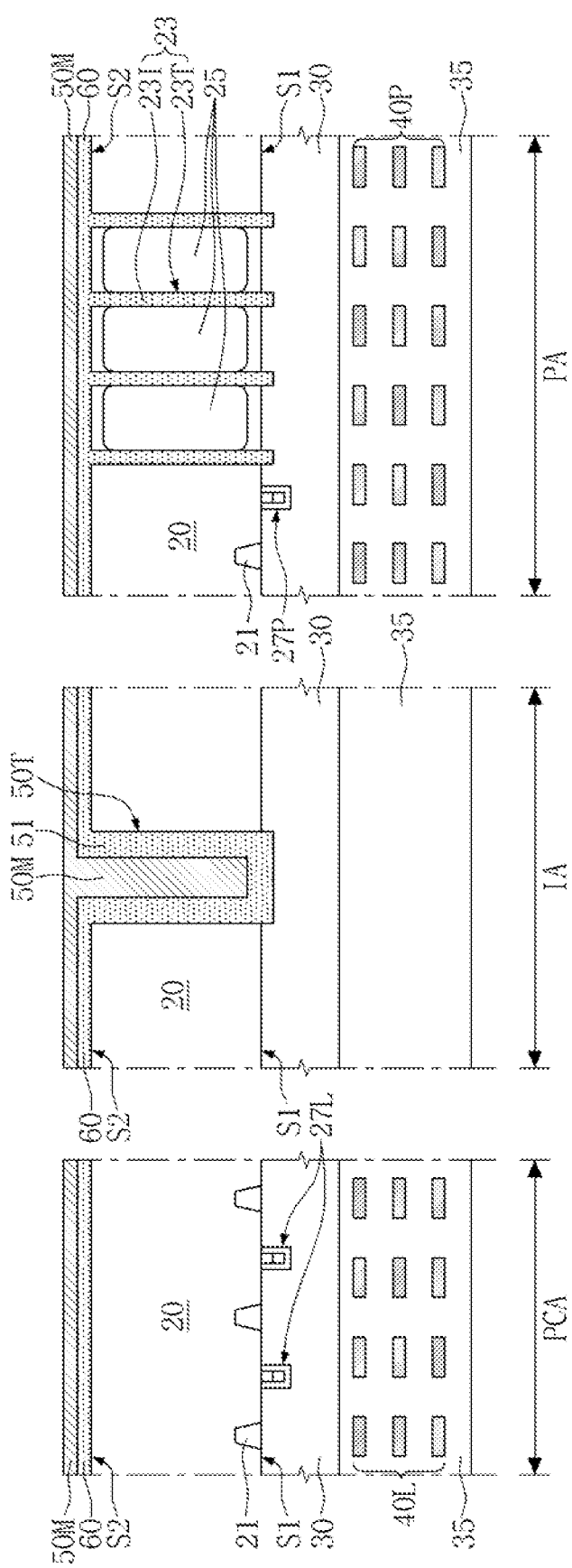
Figure 5B:
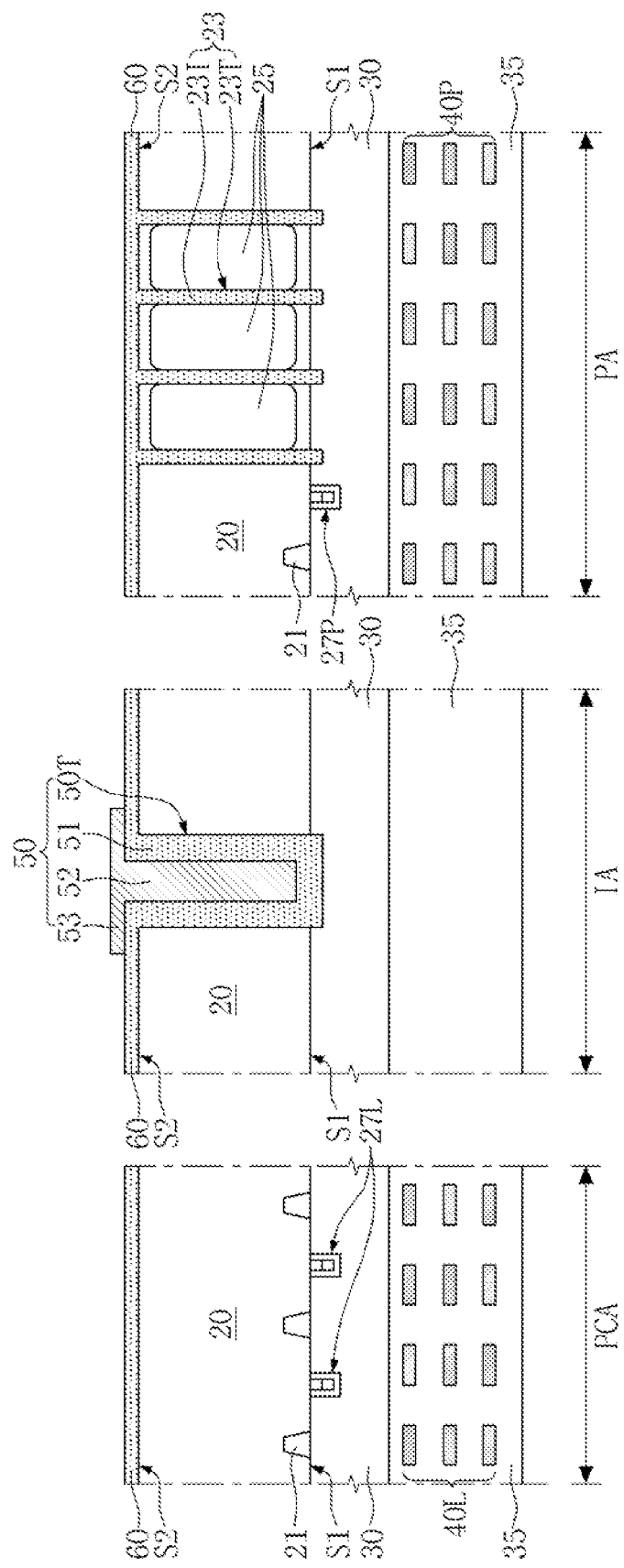

FIGS. 5A and 5B are cross-sectional views of a method of manufacturing the image sensors in accordance with an exemplary embodiment of the inventive concepts. Referring to FIG. 5A, the method of manufacturing the image sensors may include forming a shield core metal layer 50M by performing the processes described with reference to FIGS. 3A to 3C, and 4A. The shield core metal layer 50M may be entirely formed on the capping layer 60 to completely fill the shield trench 50T.

Referring to FIG. 5B, the method may include patterning the shield core metal layer 50M by performing a photolithography process and an etching process so as to form a shield core 52 and a shield pad 53. The shield core 52 and the shield pad 53 are electrically connected, and include the same material to be physically continued.

Referring back to FIG. 2C, the method may include forming a protection layer 65 on the capping layer 60 and the shield pad 53, forming an opening O which exposes a surface of the shield pad 53 by patterning the protection layer 65, and forming color filters 70 and microlenses 75 on the protection layer 65 in the pixel array PA so as to be aligned perpendicular to the photodiodes 25.

In a method of manufacturing the image sensors according to embodiments of the inventive concepts, the deep isolation areas 23 and the shielding structure 50 may be simultaneously formed using compatible processes. Thus, since the number of the processes is decreased, manufacturing costs may be decreased and productivity may be improved.

Figure 6A:
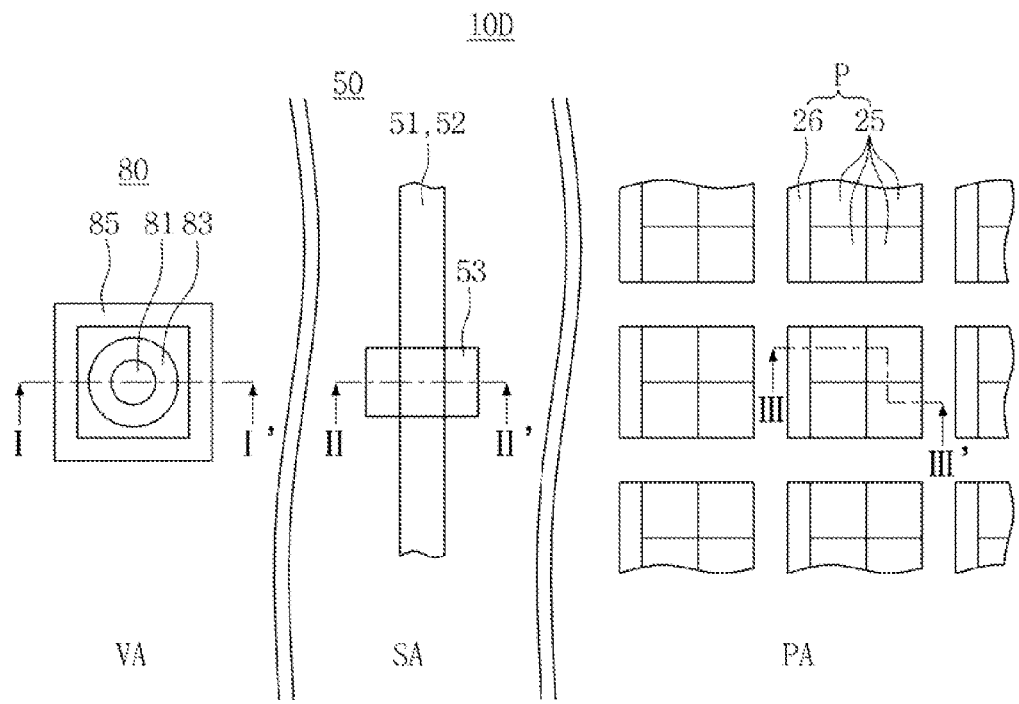
FIGS. 6A and 6B are top views or layouts of image sensors in accordance with exemplary embodiments of the inventive concepts.
Figure 6B:
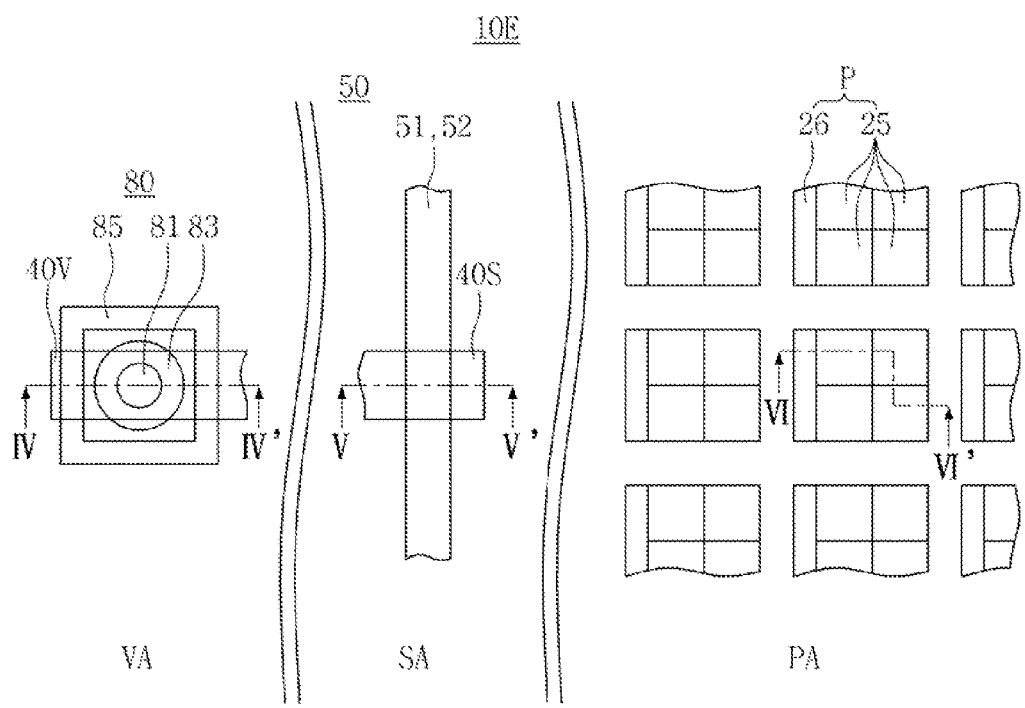

FIGS. 6A and 6B are top views or layouts of image sensors in accordance with exemplary embodiments of the inventive concepts.

Referring to FIG. 6A, the image sensor 10D according to an exemplary embodiment of the inventive concepts may include a through via area VA, a shield area SA, and a pixel array PA. Referring back to FIGS. 1A to 1C, the through via area VA may be located at a portion or the periphery of the peripheral circuit area PCA. The shield area SA may be a portion of the interface area IA. The pixel array PA may be a portion of the pixel array PA.

The through via area VA may include a through via plug 81, a through via pad 83, and a through via isolation structure 85. The through via pad 83 may overlap the through via plug 81. The through via isolation structure 85 may surround the through via plug 81 and the through via pad 83.

The shield area SA may include a shielding structure 50 and a shield pad 53 that overlaps a portion of the shielding structure 50.

The pixel array PA may include a plurality of unit pixels P. Each of the unit pixels P may include four photodiode areas 25 and a circuit area 26.

Referring to FIG. 6B, the image sensor 10E according to an exemplary embodiment of the inventive concepts may further include a through via line 40V and a shield line 40S compared with the image sensor 10D shown in FIG. 6A. The through via line 40V and the shield line 40S may electrically connect the through via plug 81 to the shielding structure 50. The through via line 40V may be electrically connected with the shield line 40S crossing the through via area VA and the shield area SA.

The image sensors 10D, 10E according to exemplary embodiments of the inventive concepts may include the shielding structure 50 having a conductive material. The peripheral circuit area PCA or the through via area VA may be electromagnetically separated from the pixel array PA. Thus, the electromagnetic interference onto the pixel array PA from the peripheral circuit area PCA and the through via area VA may be decreased.

Figure 7A:
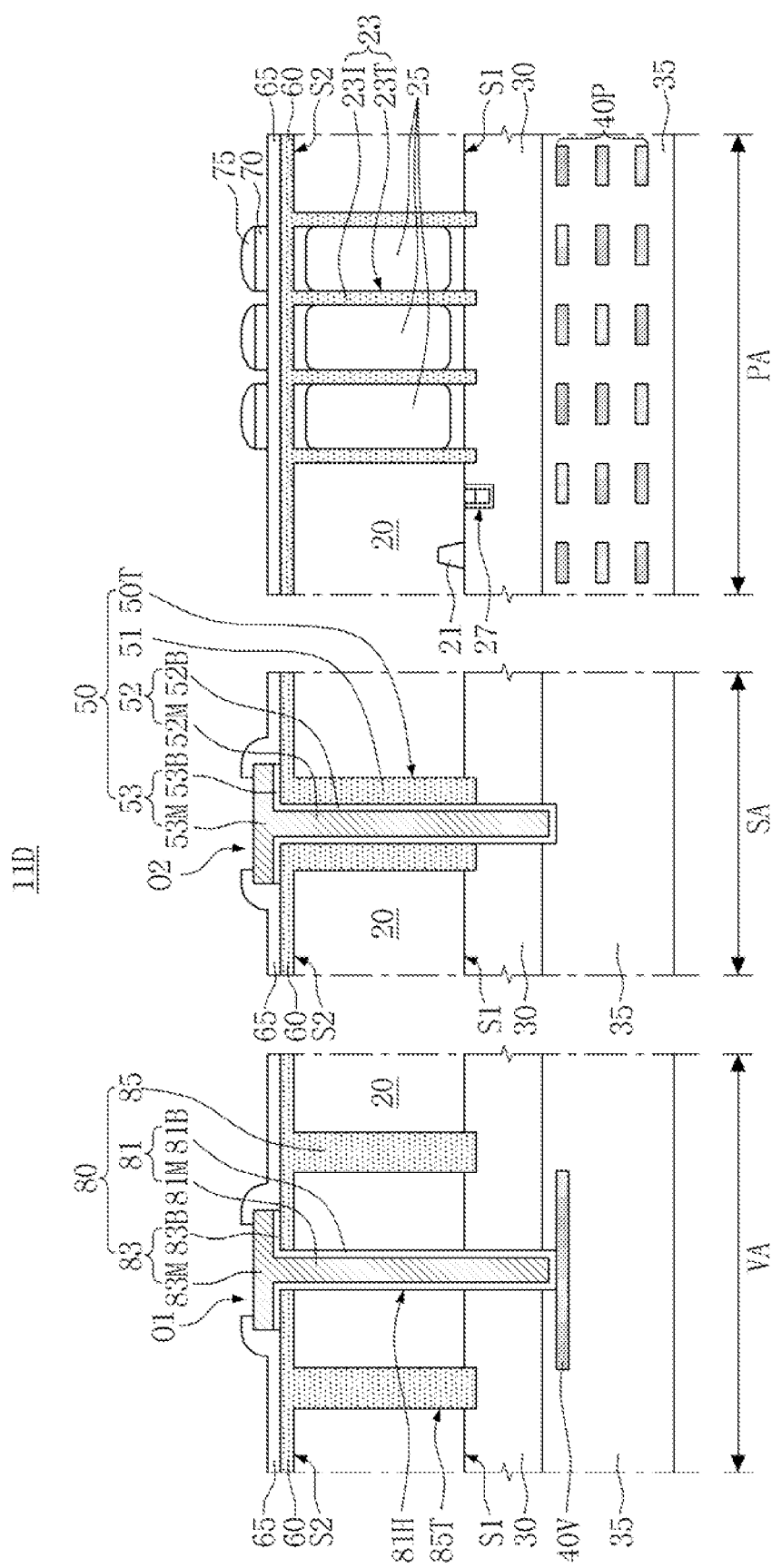

FIGS. 7A and 7B are conceptual cross-sectional views of image sensors in accordance with exemplary embodiments of the inventive concepts. FIG. 7A shows cross-sectional views taken along lines I-I' II-II', and III-III' shown in FIG. 6A. FIG. 7B shows cross-sectional views taken along lines IV-IV' V-V', and VI-VI' shown in FIG. 6B.

Referring to FIG. 7A, the image sensor 11D according to an exemplary embodiment of the inventive concepts may include a substrate 20, a transistor 27, a lower interlayer insulating layer 30, an upper interlayer insulating layer 35, metal lines 40V, 40P, a shallow isolation area 21, photodiodes 25, a deep isolation areas 23, a through via structure 80, a shielding structure 50, a capping layer 60, a protection layer 65, color filters 70, and microlenses 75. The substrate 20 includes a through via area VA, a shield area SA, and a pixel array PA. The transistor 27, the lower interlayer insulating layer 30, the upper interlayer insulating layer 35, and the metal lines 40V, 40P are disposed on a first surface S1 of the substrate 20. The shallow isolation area 21, the photodiodes 25, the deep isolation areas 23, the through via structure 80 and the shielding structure 50 are formed in the substrate 20. The capping layer 60, the protection layer 65, the color filters 70, and the microlenses 75 are disposed on a second surface S2 of the substrate 20.

The metal lines 40V, 40P may include a through via line 40V and pixel lines 40P. The through via line 40V is disposed in the upper interlayer insulating layer 35 in the through via area VA. The pixel lines 40P are disposed in the upper interlayer insulating layer 35 in the pixel array PA. The through via line 40V may be electrically connected to the through via structure 80. The metal lines 40V, 40P may include tungsten (W), aluminum (Al), copper (Cu), or another metal.

The through via structure 80 may include a through via plug 81, a through via pad 83, and a through via isolation structure 85. The through via plug 81 is disposed in a through via 81H. The through via pad 83 is disposed on the through via plug 81. The through via isolation structure 85 surrounds the through via plug 81.

The through via plug 81 may include a through via barrier layer 81B and a through via metal layer 81M. The through via barrier layer 81B is conformally formed on an inner surface of the through via 81H. The through via metal layer 81M fills the through via 81H. The through via pad 83 may include a through via pad barrier layer 83B and a through via pad metal layer 83M. The through via pad barrier layer 83B is disposed on the capping layer 60. The through via pad metal layer 83M is disposed on the through via pad barrier layer 83B. The through via barrier layer 81B and the through via pad metal layer 83M may include the same material so as to physically continue, and the through via metal layer 81M and the through via pad metal layer 83M may include the same material so as to physically continue. The through via plug 81 may be electrically connected to the through via line 40V.

The shielding structure 50 may include a shield insulating material 51, a shield core 52, and a shield pad 53. The shield insulating material 51 is disposed in a shield trench SOT. The shield core 52 is disposed in a shield core trench 52T in the shield insulating material 51. The shield pad 53 is disposed on the shield core 52. The shield core trench 52T may pass through the shield insulating material 51 and the lower interlayer insulating layer 30. The shield core 52 may include a shield core barrier layer 52B and a shield core metal layer 52M. The shield core barrier layer 52B and the shield core metal layer 52M are conformally formed on an inner surface of the shield core trench 52T. The shield pad 53 may include a shield pad barrier layer 53B and a shield pad metal layer 53M. The shield pad barrier layer 53B is disposed on the capping layer 60. The shield pad metal layer 53M is disposed on the shield pad barrier layer 53B. The shield core barrier layer 52B and the shield pad barrier layer 53B may have the same material so as to physically continue with the shield pad barrier layer 53B. The shield core metal layer 52M and the shield pad metal layer 53M may have the same material so as to physically continue with the shield pad metal layer 53M. A positive voltage (+), a negative voltage (−), or a ground voltage may be applied to the shield core 52 through the shield pad 53.

An upper surface of the through via pad 83 may be exposed through a first opening O1 of the protection layer 65. An upper surface of the shield pad 53 may be exposed through a second opening O2 of the protection layer 65.

Referring to FIG. 7B, the image sensor 11E according to an exemplary embodiment of the inventive concepts may further include a shield line 40S disposed in the shield area SA compared with the image sensor 10D shown in FIG. 7A. The shield line 40S may be disposed on the same horizontal level as the through via line 40V. The shield line 40S may be electrically connected to the through via line 40V. The shield line 40S may be electrically connected to the shield core 52. An upper surface of the shield pad 53 may not be exposed, and is covered by the protection layer 65. In another embodiment, the shield pad 53 may not be formed and may be omitted. A positive voltage (+), a negative voltage (−), or a ground voltage may be applied to the shield core 52 through the through via pad 83, the through via plug 81, the through via line 40V, and the shield line 40S.

Since the image sensors 11D, 11E according to exemplary embodiments of the inventive concepts include the shield core 52 having a conductive material, electromagnetic effects on the pixel array PA from the through via area VA may be decreased. Further, as a voltage may be applied to the shield core 52, electromagnetic shield characteristics and heat dissipation characteristics may be superior.

FIGS. 8A to 8G are views for describing a method of manufacturing the image sensor in accordance with exemplary embodiments of the inventive concepts.

Figure 8A:
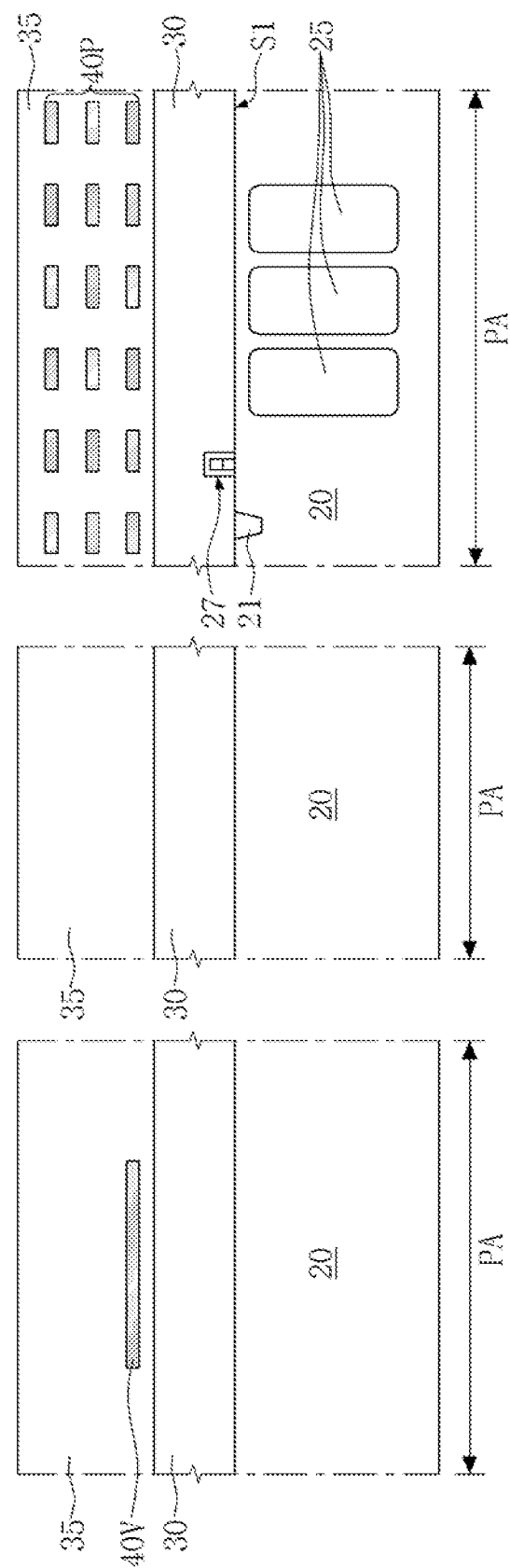

Referring to FIG. 8A, a method of manufacturing the image sensor according to an exemplary embodiment of the inventive concepts may include preparing a substrate 20 including a through via area VA, a shield area SA, and a pixel array PA, forming a shallow isolation area 21 and photodiodes 25 in the substrate 20 of the pixel array PA, and forming a transistor 27, a lower interlayer insulating layer 30, metal lines 40V, 40P, and an upper interlayer insulating layer 35 on a first surface S1 of the substrate 20.

The metal lines 40V, 40P may include a through via line 40V and a pixel line 40P. The through via line 40V is disposed in the through via area VA. The pixel line 40P is disposed in the pixel array PA. The through via line 40V and the pixel line 40P may be disposed on the same level as the lowermost pixel line 40P in the pixel array PA.

Figure 8B:
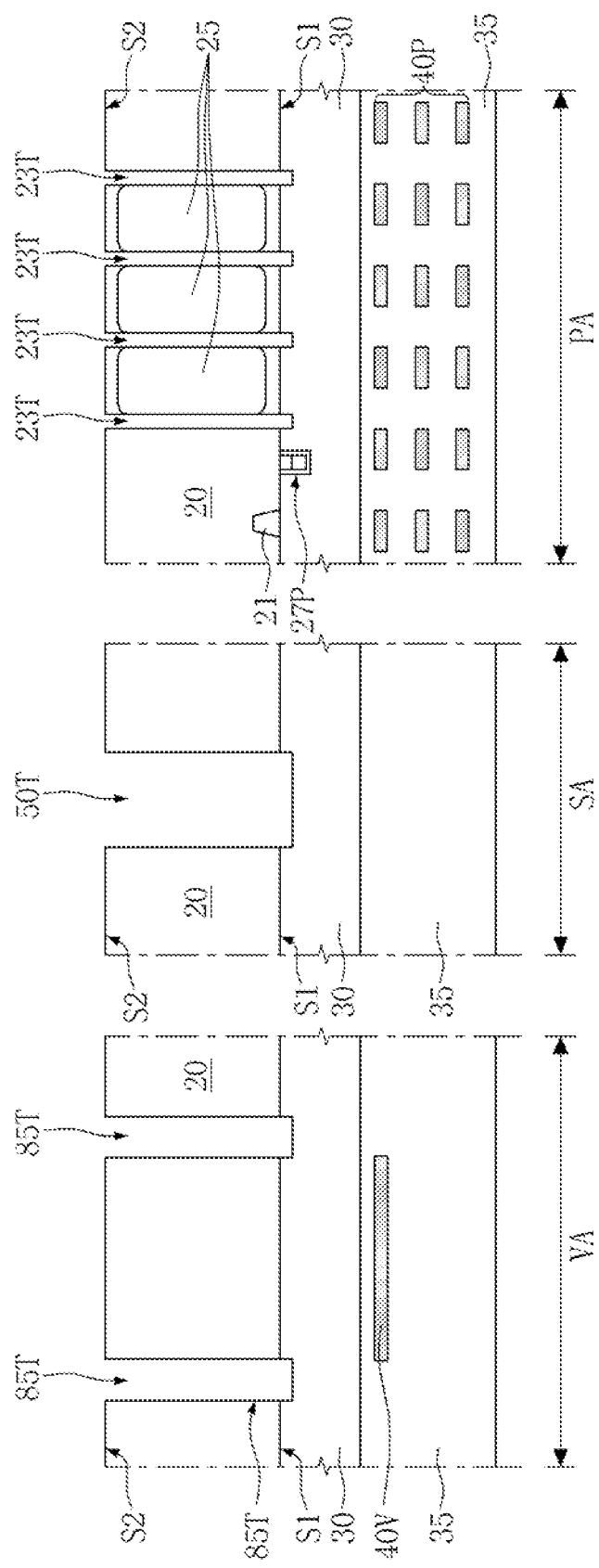

Referring to FIG. 8B, the method may include turning over the substrate 20, thinning the substrate 20 to partially recess and remove the second surface S2 of the substrate 20, and forming a through via isolation trench 85T, a shield trench 50T, and a deep isolation trench 23T in the substrate 20. Referring back to FIG. 6A, the via isolation trench 85T may be in a closed polygonal shape, the shield trench 50T may be in a linear shape, and the deep isolation trench 23T may be in a matrix shape to surround the photodiodes 25 in a top view.

Figure 8C:
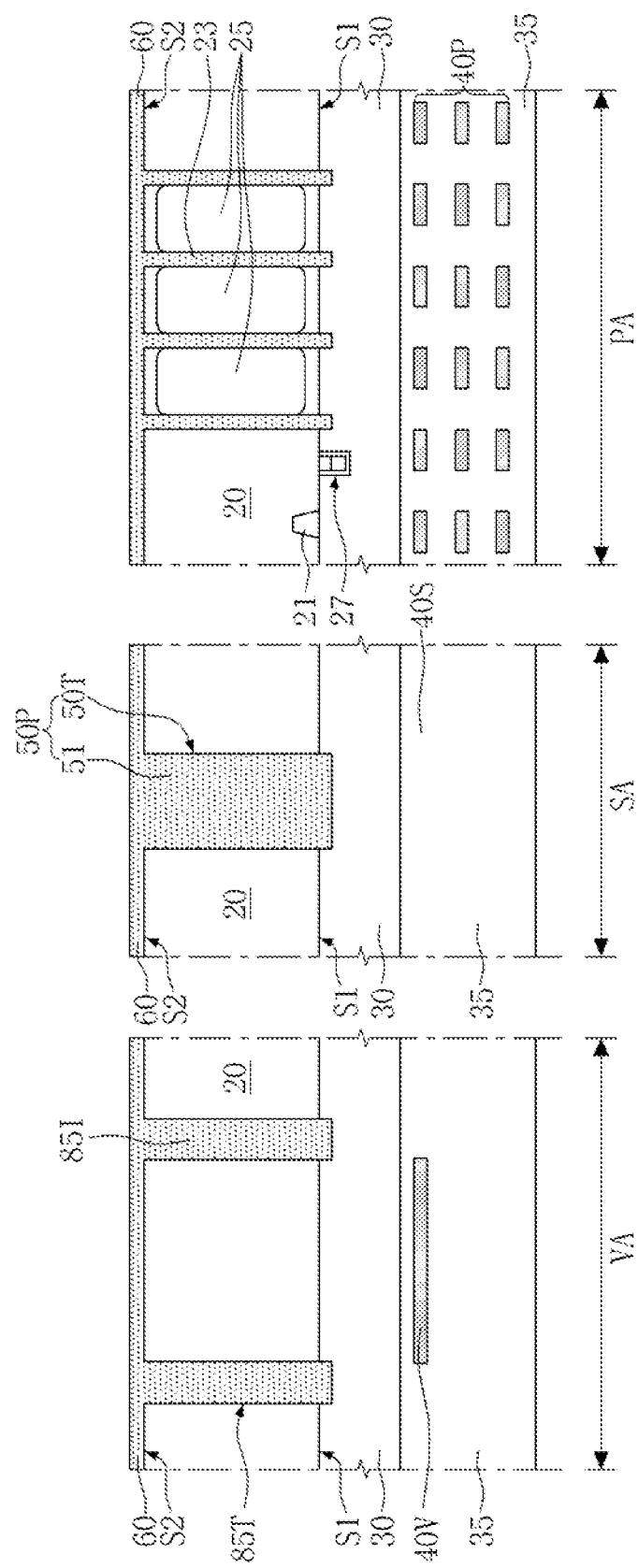

Referring to FIG. 8C, an exemplary embodiment may include performing a CVD process and/or a gap filling process to fill an insulating material in the via isolation trench 85T, the shield trench 50T and the deep isolation trench 23T to form a via isolation insulating material 85I, a preliminary shielding structure 50P, and a deep isolation area 23. The method may also include forming a capping layer 60 on the second surface S2 of the substrate 20.

Figure 8D:
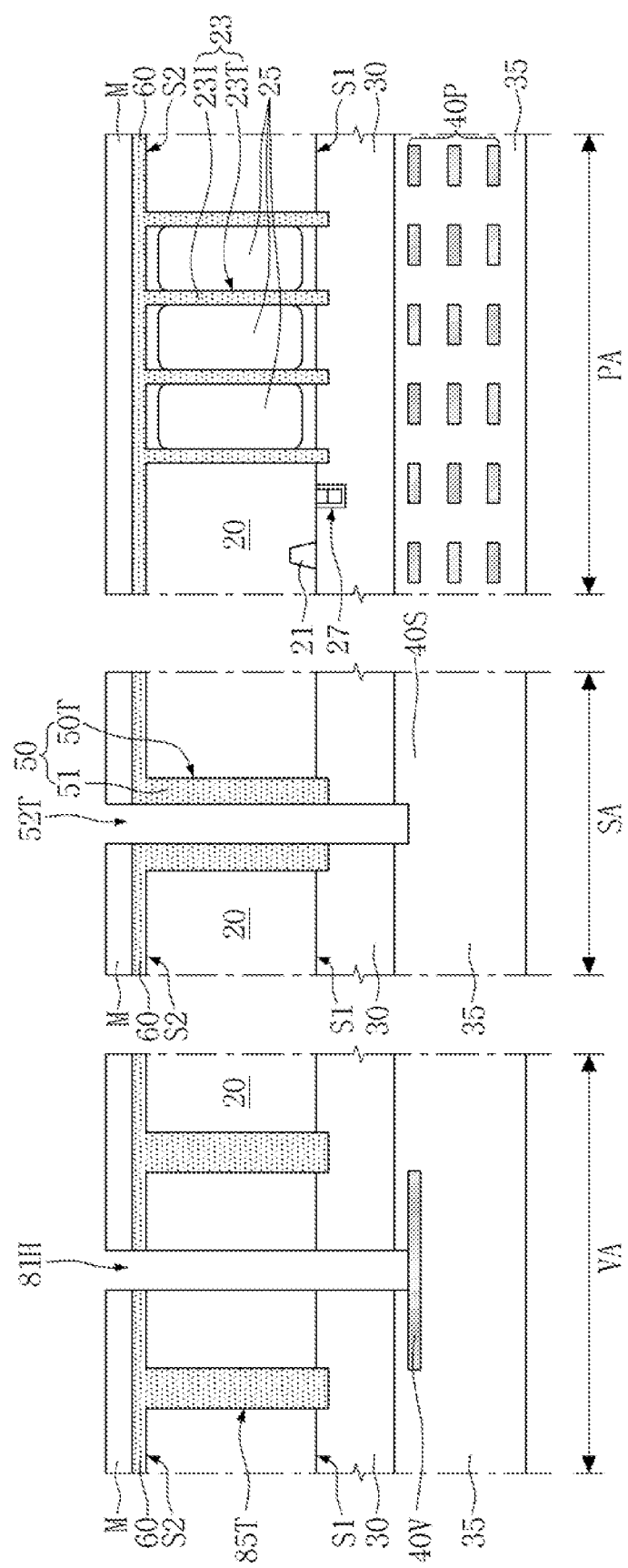

Referring to FIG. 8D, an exemplary embodiment may include forming a mask pattern M on the capping layer 60, and etching the capping layer 60 and the substrate 20 using the mask pattern M as an etch mask to form a through via 81H that passes through the capping layer 60 and the substrate 20 in the through via area VA to expose the through via line 40V. An exemplary embodiment may also include forming a shield core trench 52T in the shield area SA. The shield core trench 52T may pass through the shield insulating material 51 and the lower interlayer insulating layer 30. A lower end of the shield core trench 52T may be located in the upper interlayer insulating layer 35. Then, the mask pattern M may be removed.

Figure 8E:
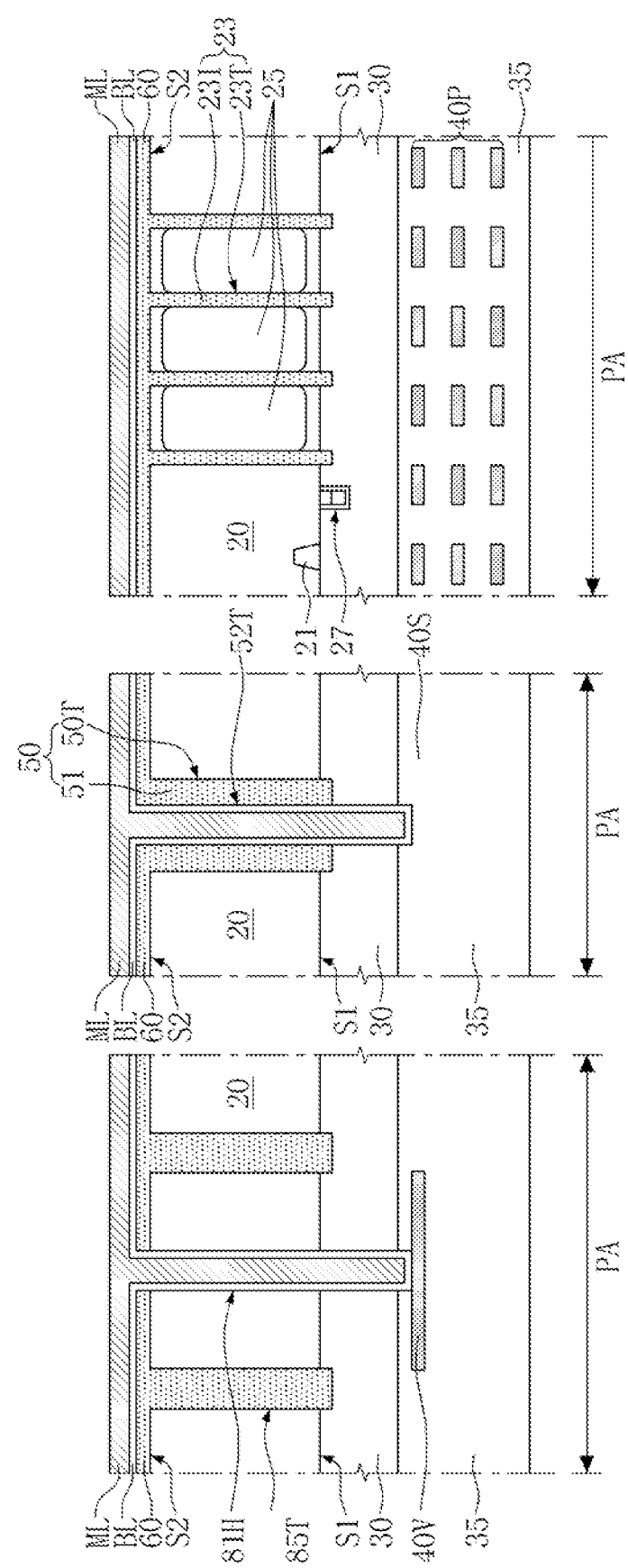

Referring to FIG. 8E, the method may include forming a barrier layer BL and a metal layer ML by performing a CVD process, a physical vapor deposition (PVD) process, an atomic layer deposition (ALD) process, and/or a plating process. The barrier layer BL may be conformally formed on an inner surface of the through via 81H, an inner surface of the shield core trench 52T, and the capping layer 60. The metal layer ML may be formed on the barrier layer BL to fill the through via 81H and the shield core trench 52T. The barrier layer BL may include a barrier metal and/or a seed metal. The barrier layer BL may include titanium (Ti), titanium nitride (TiN), titanium tungsten (TiW), or another metal. The metal layer ML may include tungsten (W), aluminum (Al), copper (Cu), or another metal.

Figure 8F:
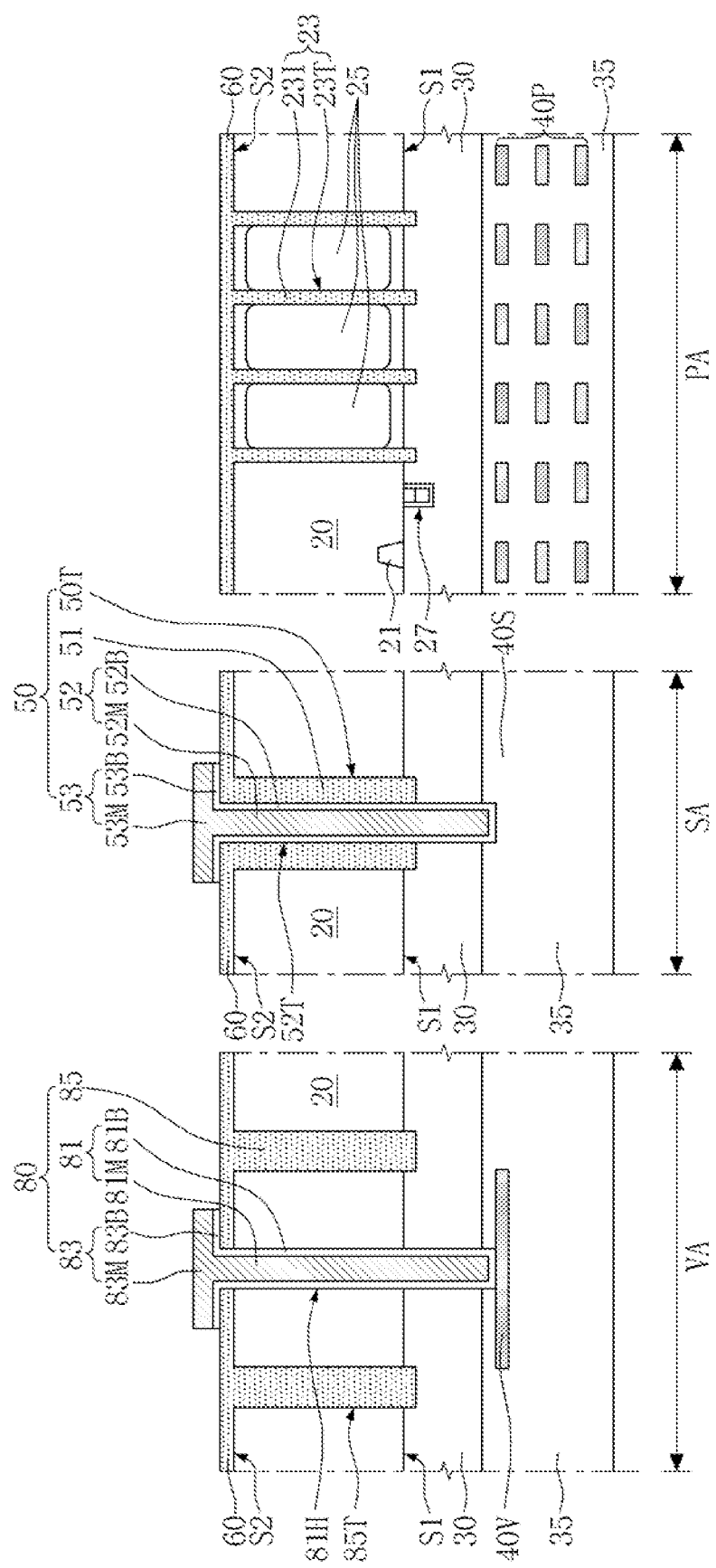

Referring to FIG. 8F, an exemplary embodiment may include patterning the metal layer ML and the barrier layer BL by performing a photolithography process or an etching process to form a through via structure 80 and a shielding structure 50. The through via structure 80 may include a through via plug 81 and a through via pad 83. The shielding structure 50 may include a shield core 52 and a shield pad 53. The through via pad 83 may include a through via pad barrier layer 83B and the through via pad metal layer 83M. The shield pad 53 may include a shield pad barrier layer 53B and a shield pad metal layer 53M.

Referring to FIG. 8G, an exemplary embodiment may include forming a protection layer 65 on the capping layer 60. The protection layer 65 includes a first opening O1 which exposes an upper surface of the through via pad 83 and a second opening O2 which exposes an upper surface of the shield pad 53.

Referring back to FIG. 7A, an exemplary embodiment may include forming color filters 70 and microlenses 75 on the protection layer 65. The color filters 70 and the microlenses 75 are aligned perpendicular to the photodiodes 25.

Figure 9A:
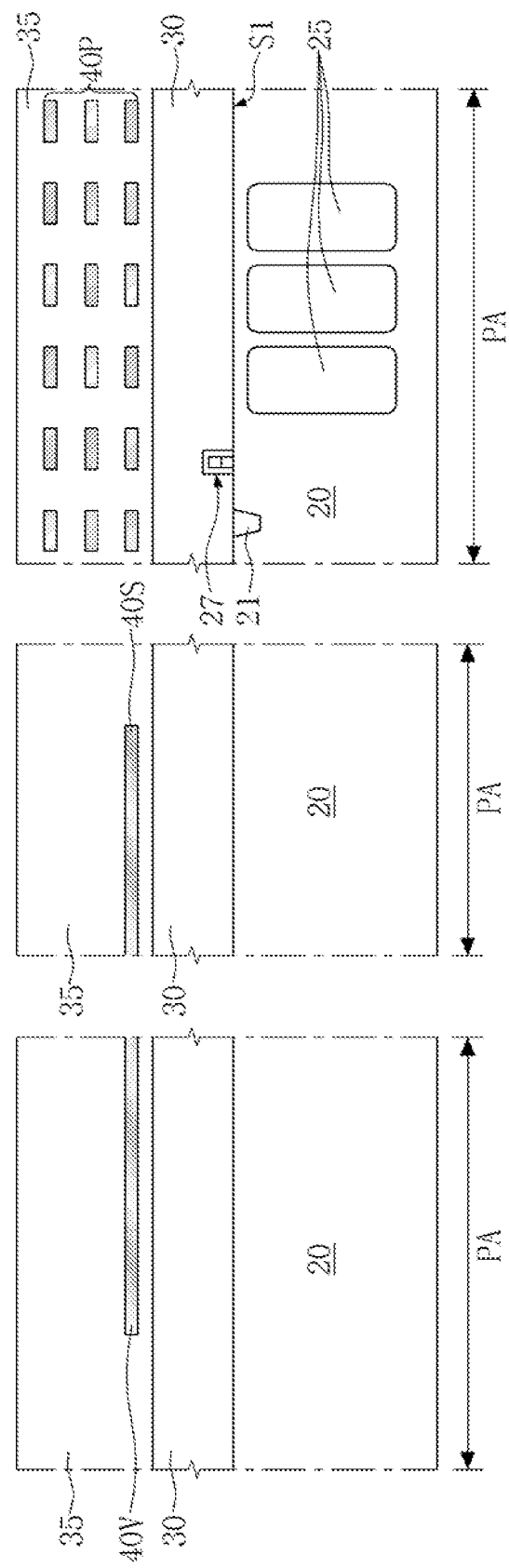

Referring to FIG. 9A, a method of manufacturing the image sensor according to an exemplary embodiment of the inventive concepts may performing the processes described with reference to FIG. 8A, preparing a substrate 20 including a through via area VA, a shield area SA, and a pixel array PA, forming a shallow isolation area 21 and photodiodes 25 in the pixel array PA of the substrate 20, and forming a transistor 27, a lower interlayer insulating layer 30, metal lines 40V, 40S, and 40P, and an upper interlayer insulating layer 35 on a first surface S1 of the substrate 20.

The metal lines 40V, 40S, 40P may include a through via line 40V, a shield line 40S, and a pixel line 40P. The through via line 40V is disposed in the through via area VA. The shield line 40S is disposed in the shield area SA. The pixel line 40P is disposed in the pixel array PA. The through via line 40V and the shield line 40S may be located at the same level as the lowermost pixel line 40P of the metal lines 40V, 40S, 40P. The through via line 40V and the shield line 40S may be electrically and physically connected.

Figure 9B:
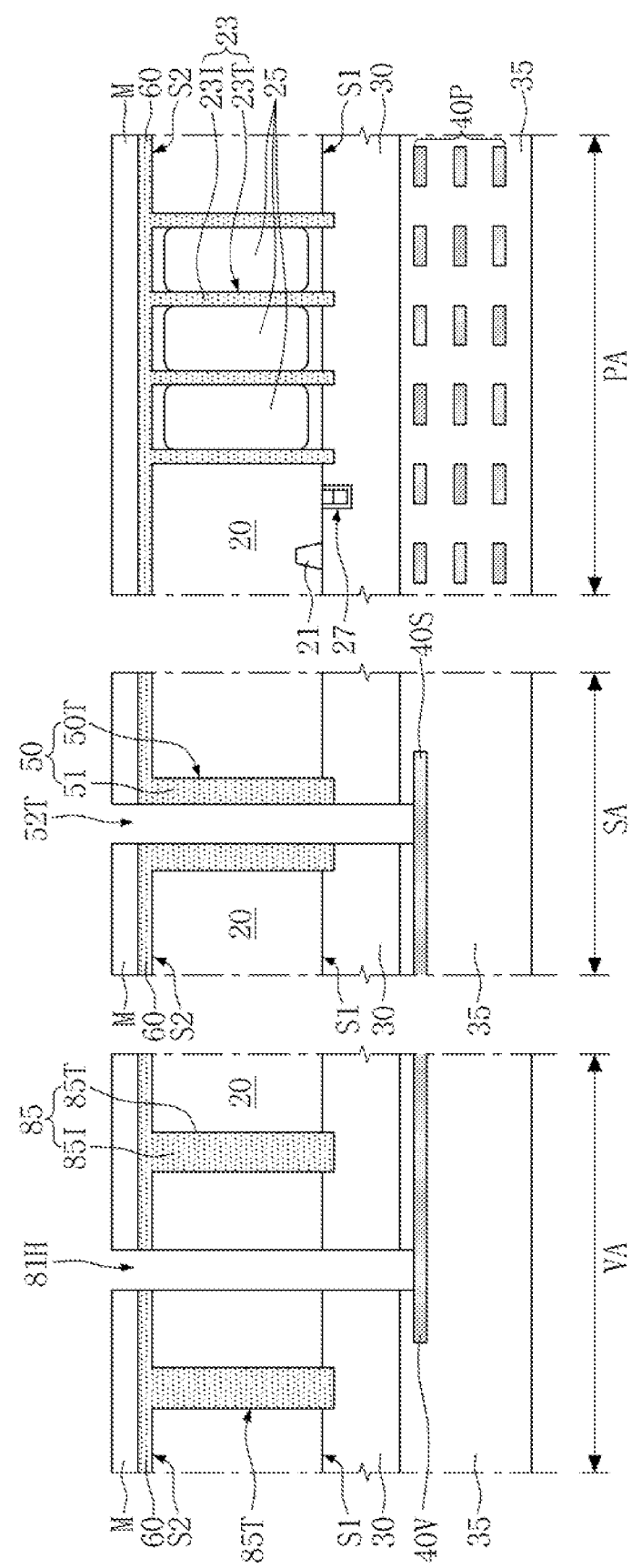

Referring to FIG. 9B, an exemplary embodiment may include forming a via isolation structure 85, a preliminary shielding structure 50, a plurality of deep isolation areas 23, and a capping layer 60 by performing the processes described with reference to FIGS. 8B to 8D, forming a mask pattern M, forming a through via 81H in the through via area VA, and forming a shield core trench 52T in the shield area SA. The through via 81H exposes the through via line 40V. The shield core trench 52T exposes the shield line 40S. Then, the mask pattern M may be removed.

Figure 9C:
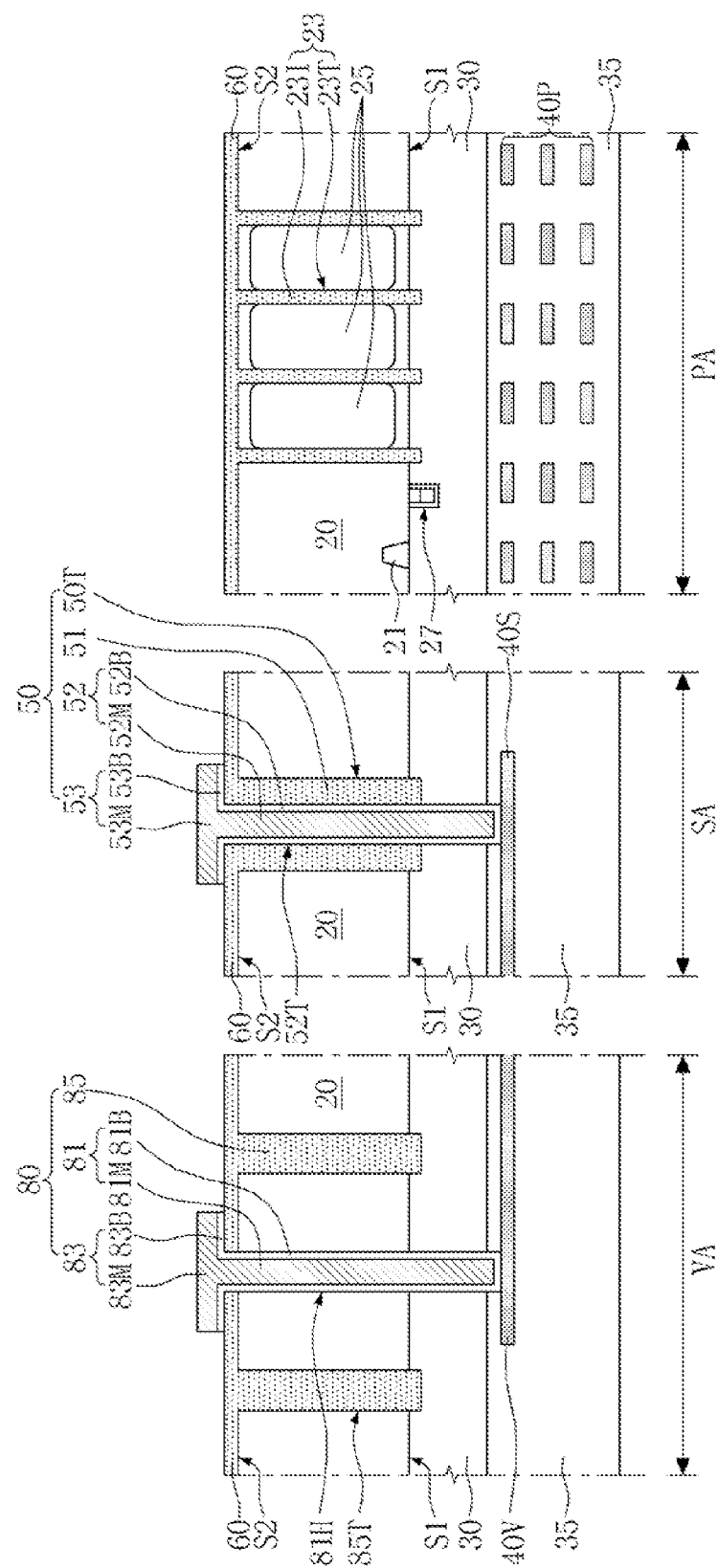

Referring to FIG. 9C, an exemplary embodiment may include forming a through via structure 80 and a shielding structure 50 by performing the processes described with reference to FIGS. 8E and 8F. The through via structure 80 may include a through via plug 81 and a through via pad 83. The shielding structure 50 may include a shield core 52 and a shield pad 53. The through via pad 83 may include a through via pad barrier layer 83B and a through via pad metal layer 83M. The shield pad 53 may include a shield pad barrier layer 53B and a shield pad metal layer 53M. Alternatively, the shield pad 53 may not be formed.

Figure 9D:
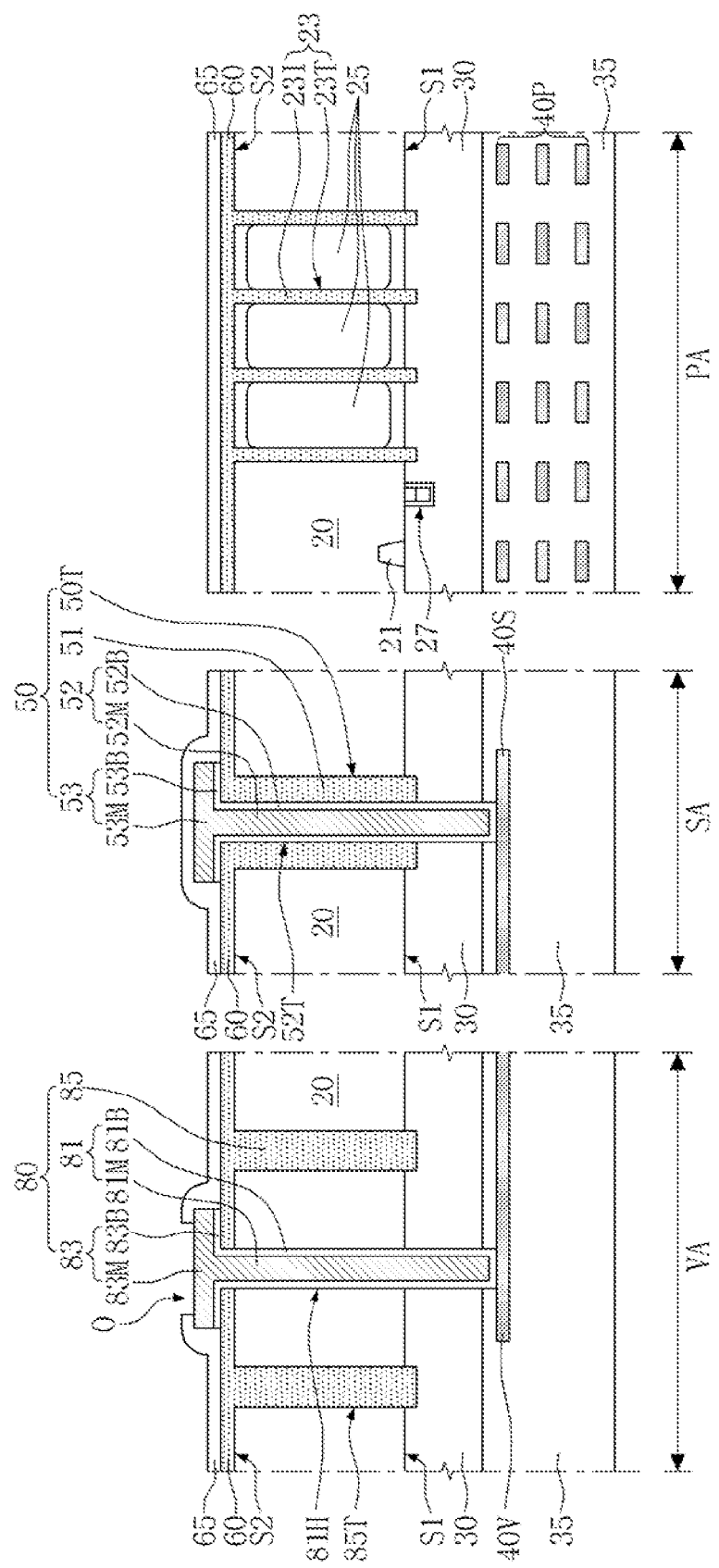

Referring to FIG. 9D, an exemplary embodiment may include forming a protection layer 65 on the capping layer 60. The protection layer 65 includes an opening O which exposes an upper surface of the through via pad 83. An upper surface of the shield pad 53 may not be exposed but may be covered by the protection layer 65.

Referring back to FIG. 7B, an exemplary embodiment may include forming color filters 70 and microlenses 75 on the protection layer 65. The color filters 70 and the microlenses 75 may be aligned perpendicular to the photodiodes 25.

Figure 10A:
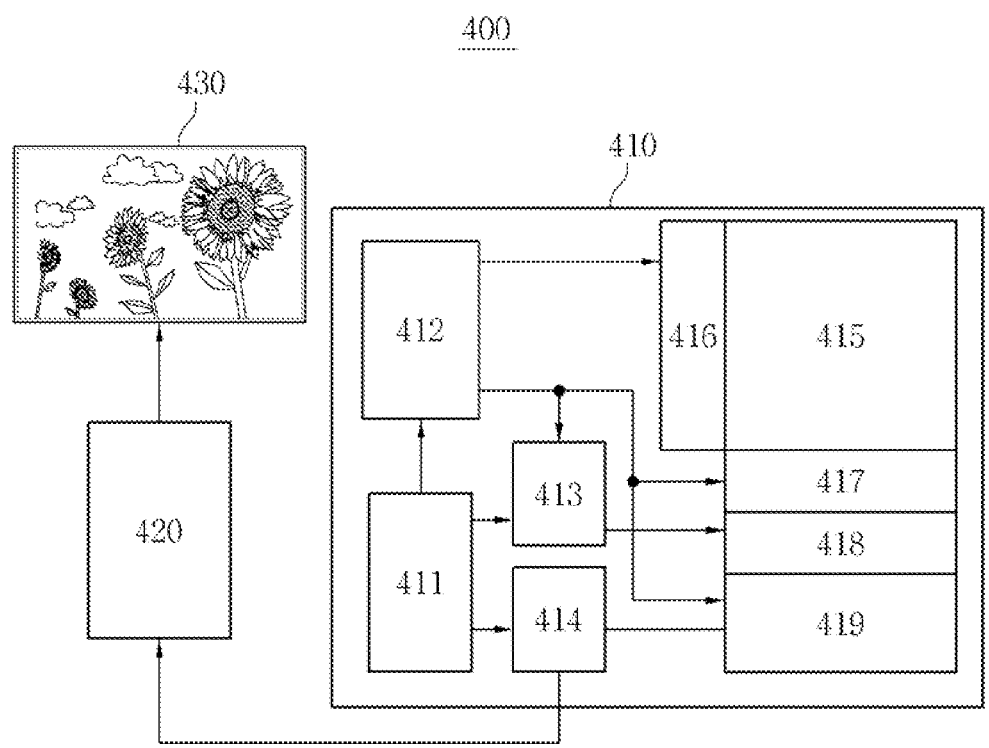
FIG. 10A is a schematic block diagram for describing a camera system including the image sensor in accordance with exemplary embodiments of the inventive concepts.

FIG. 10A is a schematic block diagram for describing a camera system including one of the image sensors 10A, 10B, 10C, 10D, 10E, 11A, 11B, 11C, 11D, 11E in accordance with exemplary embodiments of the inventive concepts. Referring to FIG. 10A, a camera system 400 according to an exemplary embodiment of the inventive concepts may include an image sensing part 410, an image signal processing part 420, and an image display part 430. The image sensing part 410 may include a control register block 411, a timing generator 412, a ramp generator 413, a buffer part 414, an active pixel sensor array 415, a row driver 416, a correlated double sampler (CDS) 417, a comparator 418, and an analog-to-digital converter 419. The control register block 411 may control overall operations of the camera system 400. The control register block 411 may directly apply operation signals to the timing generator 412, the ramp generator 413, and the buffer part 414. The timing generator 412 may generate various signals that may be reference signals for operation timings of various components of the image sensing part 410. The operation timing reference signals generated by the timing generator 412 may be transmitted to the row driver 416, the CDS 417, the comparator 418, and/or the analog-to-digital converter 419, etc. The ramp generator 413 may generate and transmit a ramp signal that may be used for the CDS 417 and/or the comparator 418. The buffer part 414 may include a latch part. The buffer part 414 may temporarily store an image signal that may be transmitted to the outside. The active pixel sensor array 415 may detect an external image. The active pixel sensor array 415 may include a plurality of active pixel sensors. Each of the active pixel sensors may include one of the image sensors 10A, 10B, 10C, 10D, 10E, 10F, 10G, 10H having a back irradiation typed image sensor in accordance with an exemplary embodiment of the inventive concepts. The row driver 416 may selectively activate a row of the active pixel sensor array 415. The CDS 417 may sample and output an analog signal generated from the active pixel sensor array 415. The comparator 418 may compare data transmitted from the CDS 417 and a slope of a ramp signal which is a feedback from the analog reference voltages and then generate various reference signals. The analog-to-digital converter 419 may convert analog image data to digital image data.

Figure 10B:
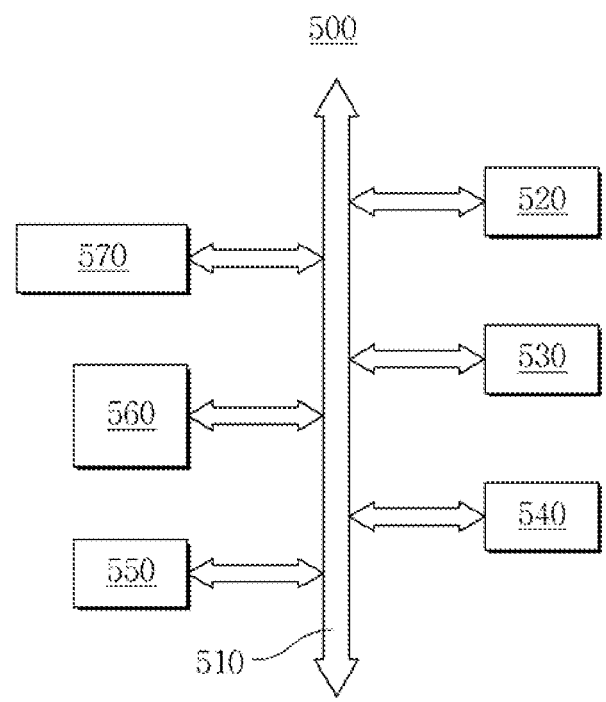
FIG. 10B is a conceptual block diagram of an electronic system in accordance with an exemplary embodiment of the inventive concepts.

FIG. 10B is a conceptual block diagram of an electronic system 500 in accordance with an exemplary embodiment of the inventive concepts. Referring to FIG. 10B, the electronic system 500 according to an exemplary embodiment of the inventive concepts may include a bus 510, an image sensing unit 520 capable of inputting and outputting signals or data through the bus 510, a central processing unit 530, and an input/output unit 540. The electronic system 500 may further include a memory drive 550. The electronic system 500 may further include an optical disc drive (ODD) 560. The electronic system 500 may further include an external communication unit 570. The image sensing unit 520 may include one of the image sensors 10A, 10B, 10C, 10D, 10E, 11A, 11B, 11C, 11D, 11E in accordance with exemplary embodiments of the inventive concepts. The central processing unit 530 may include a microprocessor. The input/output unit 540 may include one among various input devices including an operation button, a switch, a keyboard, a mouse, a keypad, a touch pad, a scanner, a camera, an optical sensor, etc., or one among a liquid crystal display (LCD), a light emitting diode (LED) and/or a cathode ray tube (CRT) monitor, a printer, and/or a device for displaying various visual information. The memory drive 550 may include a dynamic random access memory (DRAM), a static random access memory (SRAM), a phase changeable random access memory (PRAM), a resistive random access memory (RRAM), a magnetic random access memory (MRAM), a non-volatile memory (NVM), a flash memory, a solid state drive (SSD), a hard disk (HD), and/or various memory devices, or a drive thereof. For example, the ODD 560 may include a compact disc-read only memory (CD-ROM) drive, a digital video disc (DVD) drive, etc. The external communication unit 570 may include a modem, a local area network (LAN) card, or a universal serial bus (USB), etc., and may include an external memory, a wireless broadband internet (WiBro) communication device, an infrared ray communication device, etc.

In image sensors according to exemplary embodiments of the inventive concepts, a substrate of the pixel array are insulated, shielded and separated from the electrical, magnetic, material, and physical effects of the substrate of the peripheral circuit region. Thus, the electrical and thermal effects on the unit pixels of the pixel array from the peripheral circuits are decreased, and then a dark current, a white spot defect can be decreased and the heat can be easily dissipated. Therefore, the electrical, thermal, and optical operations and performances of the image sensors can be improved.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other embodiments, are intended to be included within the scope of the appended claims.

What is claimed is:

1. An image sensor comprising:
a substrate comprising a pixel array, a through via area, and a shield area disposed between the pixel array and the through via area;
a first interlayer insulating layer formed on a first surface of the substrate;
a pixel line disposed on the first interlayer insulating layer in the pixel array;
a through via line disposed on the first interlayer insulating layer in the through via area;
a second interlayer insulating layer disposed on the first interlayer insulating layer, the second interlayer insulating layer covering the pixel line and the through via line;
a through via structure configured to pass through the substrate in the through via area; and
a shielding structure passing through the substrate in the shield area,
wherein the through via structure includes:
a through via structure passing through the substrate and the first interlayer insulating layer; and
a via isolation structure passing through the substrate and surrounding the via structure, and
wherein the shielding structure passes through the substrate and electrically insulates between the pixel array and the through via area of the substrate.

2. The image sensor of claim 1,
wherein the via isolation structure comprises:
a via isolation trench passing through the substrate; and
a via isolation insulating material filling the via isolation trench,
wherein the shielding structure comprises:
a shield trench vertically passing through the substrate; and
a shield insulating material filling the shield trench, and
wherein the via isolation trench has a same depth as the shield trench.

3. The image sensor of claim 2,
wherein the through via structure comprises:
a through via passing through the substrate and the first insulating layer; and
a through via plug filling the through via,
wherein the shielding structure comprises:
a shield core trench passing through the shield insulating material and the first interlayer insulating layer; and
a shield core filling the shield core trench, and
wherein the through via has a same depth as the shield core trench.

4. The image sensor of claim 3, further comprising a shield line disposed on the first interlayer insulating layer in the shield area,
wherein the shield line is electrically connected to the shield core, and the through via line is electrically connected to the through via plug.

5. The image sensor of claim 4, wherein the shield line is electrically connected to the through via line.

6. The image sensor of claim 3, wherein the through via structure comprises a through via pad disposed on a second surface of the substrate, and
wherein the through via pad is electrically connected to the through via plug.

7. An image sensor comprising:
a substrate comprising a first area and a second area;
a first interlayer insulating layer formed on a first surface of the substrate;
a first metal line disposed on the first interlayer insulating layer in the first area, and a second metal line disposed on the first interlayer insulating layer in the second area;
a second interlayer insulating layer disposed on the first interlayer insulating layer, and covering the first and second metal lines; and
a through via structure disposed in the first area and a shielding structure disposed in the second area,
wherein the through via structure comprises a through via plug passing through the substrate and the first interlayer insulating layer in the first area, and electrically connected to the first metal line, and
wherein the shielding structure comprises a shield insulating material passing through the substrate in the second area, and contact the first interlayer insulating layer.

8. The image sensor of claim 7,
wherein the through via structure further comprises a via isolation insulating material passing through the substrate and surrounding the through via plug, and
wherein the via isolation insulating material has the same height as the shield insulating material.

9. The image sensor of claim 7,
wherein the shielding structure further comprises a shield core passing through the shield insulating material and the first interlayer insulating layer, and electrically connected to the second metal line, and
wherein the shield core has the same height as the through via plug.

10. The image sensor of claim 9, further comprising a through via pad disposed on a second surface of the substrate, and electrically connected to the through via plug, and
wherein the first metal line is electrically connected to the second metal line.

11. The image sensor of claim 10, further comprising a shield pad disposed on the second surface of the substrate, and electrically connected to the shield core.

* * * * *